United States Patent [19]

Fukumoto et al.

[11] Patent Number: 5,338,957
[45] Date of Patent: Aug. 16, 1994

[54] NONVOLATILE SEMICONDUCTOR DEVICE AND A METHOD OF MANUFACTURING THEREOF

[75] Inventors: Atsushi Fukumoto; Makoto Ohi; Hiroshi Onoda; Natsuo Ajika; Yuichi Kunori, all of Hyogo, Japan

[73] Assignee: Mitsubishi Denki Kabushiki Kaisha, Tokyo, Japan

[21] Appl. No.: 110,151

[22] Filed: Aug. 23, 1993

[30] Foreign Application Priority Data

Aug. 27, 1992 [JP] Japan .................. 4-228552

[51] Int. Cl.$^5$ .............. H01L 29/68; G11C 11/34
[52] U.S. Cl. .................. 257/316; 257/506; 257/775; 365/185
[58] Field of Search ........... 257/316, 412, 506, 773, 257/775; 365/185

[56] References Cited

U.S. PATENT DOCUMENTS 5,027,175  6/1991  Iwasa .................. 257/316

OTHER PUBLICATIONS

"0.6 μm EPROM Cell Design Based on a New Scaling Scenario", by Kuniyoshi Yoshikawa et al, 1989 IEDM Tech. Digest, pp. 587–590.

"A 3.6 μm$^2$ Memory Cell Structure for 16MB EPROMS", by Yosiaki S. Hisamune et al, 1989 IEDM Tech. Digest, pp. 583–586.

Primary Examiner—Mark V. Prenty
Attorney, Agent, or Firm—Lowe, Price, LeBlanc & Becker

[57] ABSTRACT

The width of a charge storage electrode and a control electrode in the column direction is set to be wider above an element isolation region than that above a channel region. Therefore, the capacitance between the control electrode and the charge storage electrode can be increased to improve the coupling ratio in a nonvolatile semiconductor memory device. Also, a first interconnection layer is equal in height above the control electrode and above the channel region, so that patterning of the first interconnection layer can be carried out easily and precisely.

4 Claims, 29 Drawing Sheets

NONVOLATILE SEMICONDUCTOR DEVICE AND A METHOD OF MANUFACTURING THEREOF

BACKGROUND OF THE INVENTION

1. Field of the Invention

The present invention relates to a nonvolatile semiconductor memory device that allows writing and erasing electrically, and more particularly, to improvement of a structure of a flash memory.

2. Description of the Background Art

A flash memory is known that allows data writing arbitrarily and electric erasure of the written information charge.

FIG. 27 is a block diagram showing a structure of a general flash memory. Referring to FIG. 27, a flash memory includes a memory cell matrix 100 arranged in rows and columns, an X address decoder 200, a Y gate 300, a Y address decoder 400, an address buffer 500, a write circuit 600, a sense amplifier 700, an input/output buffer 800, and a control logic 900.

Memory cell matrix 100 includes internally a plurality of memory transistors arranged in the matrix. X address decoder 200 and Y gate 300 are connected to select a row and column in memory cell matrix 100.

Y address decoder 400 applying information for selection of a column is connected to Y gate 300. Address buffer 500 for storing address information temporarily is connected to X address decoder 200 and Y address decoder 400.

Write circuit 60 for carrying out a write operation at the time of data input and sense amplifier 700 for determining "0" and "1" by the current value at data output are connected to Y gate 300. Input/output buffer 800 for temporarily storing respective output data is connected to write circuit 600 and sense amplifier 700.

Control logic 900 for controlling the operation of the flash memory is connected to address buffer 500 and input/output buffer 800. Control logic 900 carries out control according to a chip enable signal, an output enable signal, and a program signal.

FIG. 28 is an equivalent circuit diagram showing schematically the structure of memory cell matrix 100 of FIG. 27. Referring to FIG. 28, a matrix structure is formed where a plurality of word lines $WL_1, WL_2, \ldots, WL_i$ extending in the row direction are orthogonal to a plurality of bit lines $BL_1, BL_2, \ldots, BL_j$ extending in the column direction.

At the crossing of each word line and each bit line, a memory transistor $Q_{11}, Q_{12}, \ldots, Q_{ij}$ each having a floating gate is arranged. The drain region of each memory transistor is connected to each bit line.

The source region of each memory transistor is connected to each of source lines $S_1, S_2, \ldots$. The source regions of memory transistors belonging to the same row are connected to each other as shown in the drawing.

FIG. 29 is a sectional view of one memory transistor forming the above-described flash memory. This flash memory is referred to as a stacked gate type flash memory.

FIG. 30 is a plan view showing a plane structure of a conventional stacked gate type flash memory. For the sake of simplicity, a first conductive layer 10, an interlayer insulating film 12, and a bit line 13 described afterwards are not indicated in FIG. 30.

FIG. 31 is a sectional view of the flash memory of FIG. 30 in the direction of the arrow of line X—X.

The structure of a conventional stacked gate type flash memory will be described hereinafter with reference to FIGS. 29-31.

On the main surface of a p type semiconductor substrate 1, (m×n) charge storage electrodes 3 of polysilicon arranged in a matrix of m rows and n columns are arranged with a first insulating film 2 of $SiO_2$ therebetween.

An element isolation region 4 is formed between each column across over two adjacent rows of charge storage electrodes 3. On charge storage electrode 3, m control electrodes 6 of polysilicon corresponding to each row is formed with a second insulating film 5 of $SiO_2$ therebetween.

An n type drain region 7 having an impurity concentration of $5 \times 10^{19}$ cm$^{-3}$ and a sheet resistivity of 80 $\Omega/\square$ is formed in the region surrounded by element isolation region 4 and charge storage electrode 3 from the main surface of semiconductor substrate 1 to a predetermined depth. On the main surface of semiconductor substrate 1 outside charge storage electrode 3 sandwiching drain region 7, an n type source region 8 having an impurity concentration of $1 \times 10^{21}$ cm$^{-3}$ and a sheet resistivity of 50 $\Omega/\square$ and in a predetermined depth is formed.

On the main surface of semiconductor substrate 1, a third insulating film 9 is foraged to cover charge storage electrode 3 and control electrode 6, and to partially overlap drain region 7.

On drain region 7, a first interconnection layer 10 of polysilicon is provided that is formed along the sidewall of the third insulating film 9 and that is electrically connected to drain region 7. A second interconnection layer 11 of a refractory metal material such as tungsten is provided extending upwards in first interconnection layer 10 above drain region 7.

Second interconnection layer 11 is connected to a bit line 13 formed on an interlayer insulating film 12 covering third insulating film 9 and first interconnection layer 10.

The operation of a stacked gate type flash memory of the above structure will be described with reference to FIG. 29.

In a writing operation, a voltage $V_j$ of the level of 3-7 V is applied to n type drain region 7. A voltage $V_g$ of the level of 9-13 V is applied to control gate electrode 6. n type source region 8 and p type semiconductor substrate 1 are maintained at ground potential.

Here, a current of several 100 $\mu$m flows across the channel of the memory transistor. Electrons accelerated in the proximity of drain region 7 among the electrons flowing from source region 8 to drain region 7 become electrons having high energy in this area. Some of these electrons having such high energy pass over the boundary of the energy barrier between oxide film 2 and silicon substrate 1 to be injected to charge storage electrode 3 as shown by the arrow A in the drawing.

Therefore, the threshold voltage $V_{th}$ of the memory transistor is increased when electrons are stored in charge storage electrode 3. The state where this threshold voltage $V_{th}$ becomes higher than a predetermined value corresponds to the written state of "0".

In an erasing operation, a voltage $V_s$ of the level of 7-13 V is applied to n type source region 8. Control electrode 6 and p type semiconductor substrate 1 are maintained at ground potential. n type drain region 7 is opened. The electrons in charge storage electrode 3 pass through the thin gate oxide film 2 by tunneling phenomenon as shown in the arrow B in the drawing due to an electric field caused by voltage $V_s$ applied to n type source region 8.

Therefore, the threshold voltage $V_{th}$ of the memory transistor is decreased due to electrons drawn from charge storage electrode 3. The state where threshold voltage $V_{th}$ is lower than a predetermined value is referred to as the erased state of "1".

Because source region 8 in each memory transistor is connected as shown in FIG. 28, all memory cells can be erased by one time by this erase operation.

In a reading operation, a voltage $V_G'$ of a level of 5 V and a voltage $V_D'$ of a level of 1-2 V are applied to control gate electrode 6 and n type drain region 7, respectively. Here, determination is made whether current flows across the channel region in a memory transistor, i.e. determination is made of the above described state of "0" and "1" on the basis of whether the memory transistor is ON or OFF.

A method of manufacturing a stacked gate type flash memory of the above structure will be described hereinafter with reference to FIGS. 32–46. FIGS. 32–46 are sectional views of a conventional stacked gate type flash memory having the sectional view of FIG. 1, showing the sequential manufacturing steps thereof.

Referring to FIG. 32, a first insulating film 2 of an oxide film is formed in the thickness of approximately 100 Å on a p type semiconductor substrate 1. On first insulating film 2, a first polysilicon layer 3 of approximately 1000 Å in thickness is formed by a CVD method to be patterned to a predetermined configuration.

A second insulating film 5 is formed on first polysilicon layer 3. Second insulating film 5 has a multilayered film of 3 layers. Second insulating film 5 includes an oxide film 5a of approximately 1000 Å, and a nitride film 5b of approximately 100 Å thereupon by a CVD method. Then, an oxide film 5c of approximately 100 Å is formed on nitride film 5b to complete second insulating film 5.

A second polysilicon layer 6 of approximately 2500 Å in thickness is formed on second insulating film 5. An oxide film 9 is formed on second polysilicon layer 6. A resist film 71 having a pattern shown in FIG. 34 is formed on oxide film 9. FIG. 33 is a sectional view of the flash memory of FIG. 34 in the direction of the arrow of line Z—Z.

Referring to FIG. 33, oxide film 9, second polysilicon layer 6, second insulating film 5, and first polysilicon layer 3 are sequentially etched anisotropically using resist film 71 as a mask to form a charge storage electrode 3 and a control electrode 6. The etching process is carried out so that the width of charge storage electrode 3 and control electrode 6 in the column direction are identical.

Referring to FIG. 35, resist film 71 is removed. Then, a resist film 72 is formed on semiconductor substrate 1 which becomes a source region. Using resist film 72, charge storage electrode 3 and control electrode 6 as a mask, arsenic is introduced to the surface of semiconductor substrate 1 under the condition of 35 keV and $5.0 \times 10^{14}$ cm$^{-2}$ to form a drain region of an n type impurity region having an impurity concentration of $5 \times 10^{19}$ cm$^{-3}$ and a sheet resistivity of 80 Ω/□.

Referring to FIG. 36, resist film 72 is removed. Then, the surface of drain region 7 is covered with a resist film 73. Using resist film 73, charge storage electrode 3, and control electrode 6 as a mask, arsenic is introduced to the surface of semiconductor substrate 1 under the condition of 35 keV and $1 \times 10^{16}$ cm$^{-2}$ to form a source region 8 of an n type impurity region having an impurity concentration of $1 \times 10^{21}$ cm$^{-3}$ and a sheet resistivity of 50 Ω/□.

Referring to FIG. 37, resist film 73 is removed. Then, an oxide film 9 is formed on semiconductor substrate 1. Oxide film 9 is etched anisotropically to be removed. As a result, a sidewall insulating film 9 of an oxide film is formed as shown in FIG. 38.

Referring to FIG. 39, an oxide film 9 is formed again on the surface of semiconductor substrate 1. Referring to FIG. 40, a resist film 74 is formed having an opening only above drain region 7. Using resist film 74 as a mask, oxide film 9 on drain region 7 is removed by etching.

Referring to FIG. 41, a polysilicon 10 is deposited on the surface of semiconductor substrate 1. On polysilicon 10, a resist film 75 is formed so as to cover drain region 7.

Referring to FIG. 42, polysilicon 10 is etched anisotropically to be removed. This results in a first interconnection layer 10 that is electrically connected to drain region 7 and that is formed along the sidewall of sidewall insulating film 9.

Referring to FIG. 43, an interlayer insulating film 12 is deposited on the surface of semiconductor substrate 1 by TEOS or the like. A wet reflow at approximately 900° C. is carried out for 30 minutes to planarize the surface of interlayer insulating film 12. As a result, an interlayer insulating film 12 having the surface planarized is formed as shown in FIG. 44.

Referring to FIG. 45, a resist film 76 having a pattern in which a predetermined hole is formed above drain region 7 is provided on interlayer insulating film 12. Using resist film 76 as a mask, interlayer insulating film 12 is removed by anisotropic etching to form a contact hole 11a.

Referring to FIG. 46, a second interconnection layer 11 of refractory metal such as tungsten is formed inside contact hole 11a. Then, a bit line 13 is formed on interlayer insulating film 12. Thus, a stacked gate type transistor memory is completed.

A nonvolatile semiconductor memory device represented by the above described stacked gate type flash memory has problems set forth in the following.

Low voltage is required by improvement of the "coupling ratio" represented by the capacitance between control electrode 6 and charge storage electrode 3 (referred to as $C_{CF}$ hereinafter) and the capacitance between charge storage electrode 3 and semiconductor substrate 1 (referred to as $C_{FS}$ hereinafter) as shown in FIG. 47. The coupling ratio is defined as:

$$C_{CF}/(C_{FS}+C_{CF}) \tag{1}$$

For example, in a nonvolatile semiconductor memory device with a coupling ratio of 0.5, a voltage of 5 V is applied to charge storage electrode 3 when the voltage applied to control electrode 6 is 10 V.

By setting a coupling ratio of 0.7, a voltage of approximately 7 V is to be applied to control electrode 6 when a voltage of 5 V of charge storage electrode 3 is required to achieve a low voltage.

Also, a stepped portion is generated in first interconnection layer 10 above control electrode 6 formed above drain region 7 and above element isolation region 4 as shown in FIG. 48, in the above-described nonvolatile semiconductor memory device.

This stepped portion is the cause of the problem that is difficult to form a first interconnection layer 10 of a desired configuration in the processing step thereof.

In the worst case, an adjacent first interconnection layer 10 may become conductive in the region above element isolation region 4 (the region indicated by the arrow F in the drawing) as shown in FIG. 48.

SUMMARY OF THE INVENTION

An object of the present invention is to provide a semiconductor memory device that allows low voltage in a nonvolatile semiconductor memory device by improving the coupling ratio.

Another object of the present invention is to provide a method of manufacturing a nonvolatile semiconductor device that has the stepped portion of a first interconnection layer reduced and that facilitates the patterning process.

To accomplish the above objects, a nonvolatile semiconductor memory device according to the present invention includes a semiconductor substrate having a main surface, (m×n) charge storage electrodes arranged in a matrix of m rows and n columns on the main surface of the semiconductor substrate with a first insulating film thereunder, a pair of impurity regions serving as source/drain regions formed at the main surface of the semiconductor substrate with a predetermined distance therebetween so as to sandwich in the column direction a channel region provided right beneath the charge storage electrode, an element isolation region formed between each column and across two adjacent rows of charge storage electrodes, and m control electrodes formed for each row and on a charge storage electrode with a second insulating film thereunder.

The width in the column direction of the charge storage electrode and the control electrode above the element isolation region is set wider than the width in the column direction of the same above the channel region.

In the nonvolatile semiconductor device of the present invention, the opposing area between the control electrode and the charge storage electrode can be increased while maintaining the opposing area between the charge storage electrode and the semiconductor substrate. Therefore, the capacitance ($C_{CF}$) between the control electrode and the charge storage electrode is increased.

Thus, the coupling ratio of the nonvolatile semiconductor memory device can be improved. Even if the voltage applied to the control electrode is reduced in comparison with the conventional case, the same voltage can be applied to the charge storage electrode.

A method of manufacturing a nonvolatile semiconductor memory device according to the present invention includes the following steps.

An element isolation region and an active region are formed alternately in the column direction at the main surface of a semiconductor substrate. On the active region, a charge storage electrode in a matrix of m rows and m columns is formed with a first insulating film therebetween and partially overlapping the element isolation region.

A control electrode is formed on the charge storage electrode with a second insulating film therebetween. Then, a patterning process is carried out so that the width of the charge storage electrode and the control electrode in the column direction above the element isolation region is wider than those in the column direction above the active region.

Using the charge storage electrode and the control electrode as a photomask, predetermined impurities are introduced into the active region to form a pair of impurity regions serving as the source/drain region.

Because the distance between the storage charge electrodes and the distance between the control electrodes above the element isolation region are reduced, an oxide film at the time of sidewall insulating film formation can be planarized in a desired configuration above the charge storage electrode and the control electrode.

Thus, patterning of a first interconnection layer can be carried out easily and accurately. Also, reliability of a nonvolatile semiconductor memory device can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
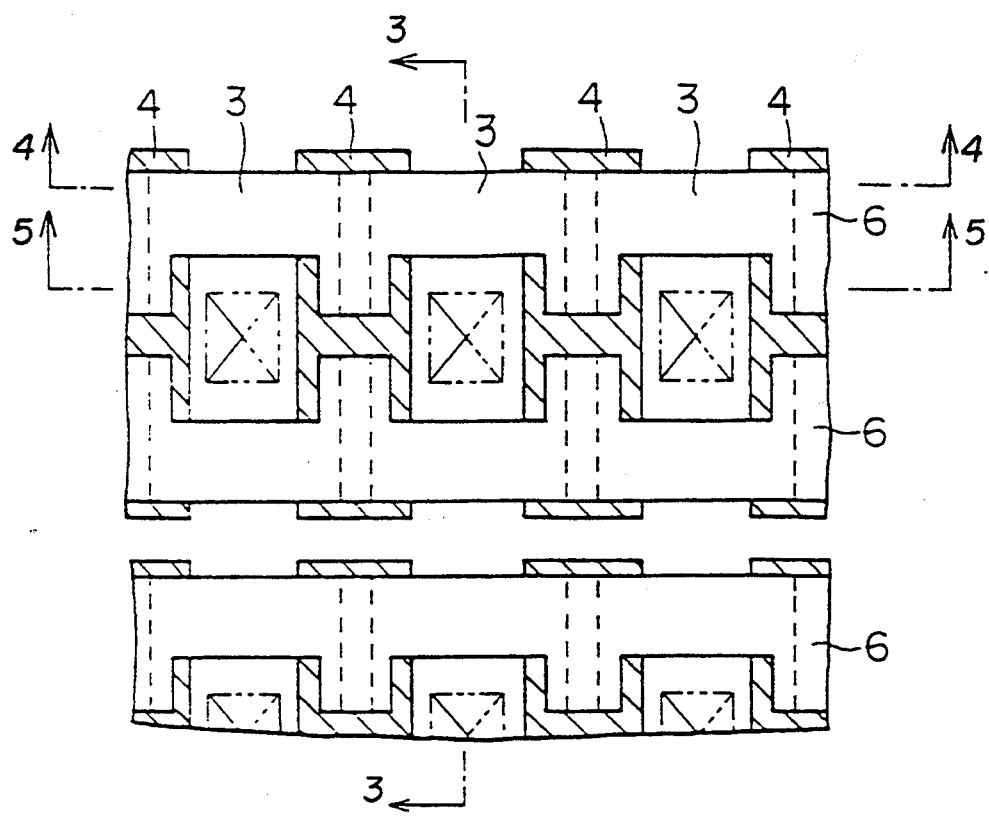
FIG. 1 is a plan view showing a structure of a nonvolatile semiconductor memory device according to the present invention.

Embodiments of a nonvolatile semiconductor memory device according to the present invention will be described hereinafter with reference to the drawings. FIG. 1 is a plan view of a stacked gate type flash memory according to the present invention. For the sake of simplicity, a first conductive layer 10, an interlayer insulating film 12, and a bit line 13 described afterwards are not illustrated.

Figure 2:
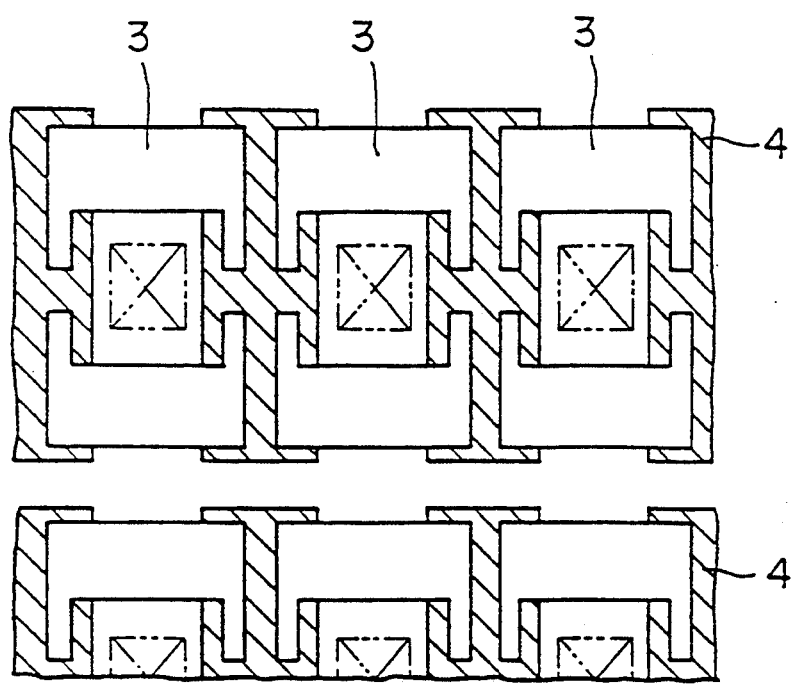
FIG. 2 is a plan view showing the configuration of a charge storage electrode of a nonvolatile semiconductor memory device according to the present invention.

FIG. 2 is a plan view showing the configuration of a charge storage electrode 3 of a stacked gate type flash memory according to the present invention.

Figure 3:
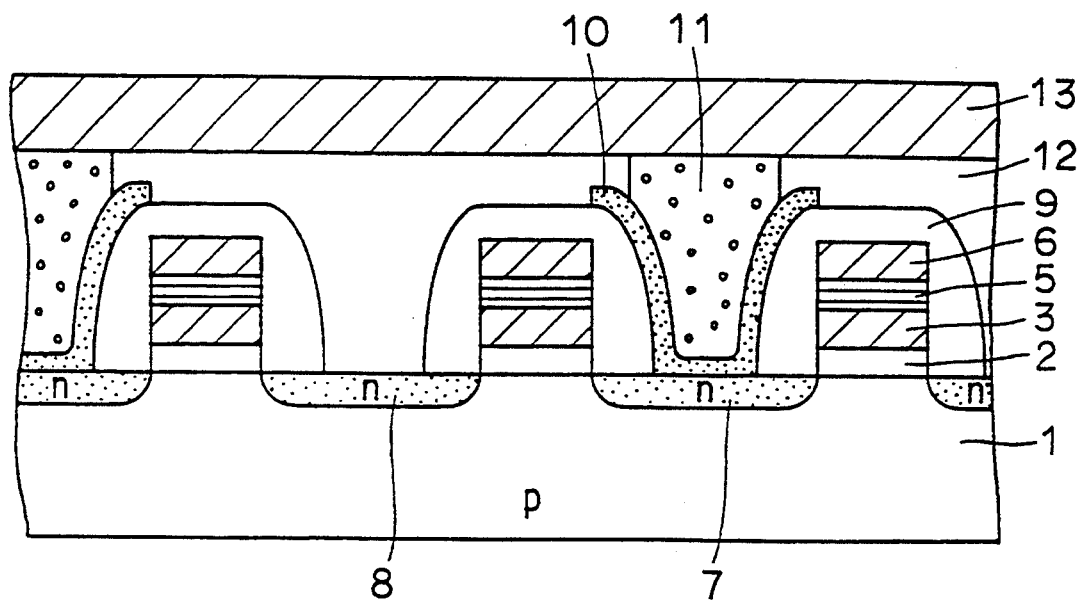
FIG. 3 is a sectional view of the nonvolatile semiconductor memory device of FIG. 1 taken in the direction of the arrow of line Y—Y.

FIG. 3 is a partial sectional view corresponding to the section taken along line Y—Y in FIG. 1.

Referring to FIGS. 1–3, a p type semiconductor substrate 1 having a main surface, and (m×n) charge storage electrodes 3 arranged in a matrix of m rows and n columns of SiO₂ on the main surface of p type semiconductor substrate 1 with a first insulating film 2 thereunder are arranged.

An element isolation region is formed between each column across two adjacent rows of charge storage electrode 3. On charge storage electrode 3, m control electrodes 6 are formed for each row with a second insulating film 5 of SiO₂ therebetween.

Figure 4:
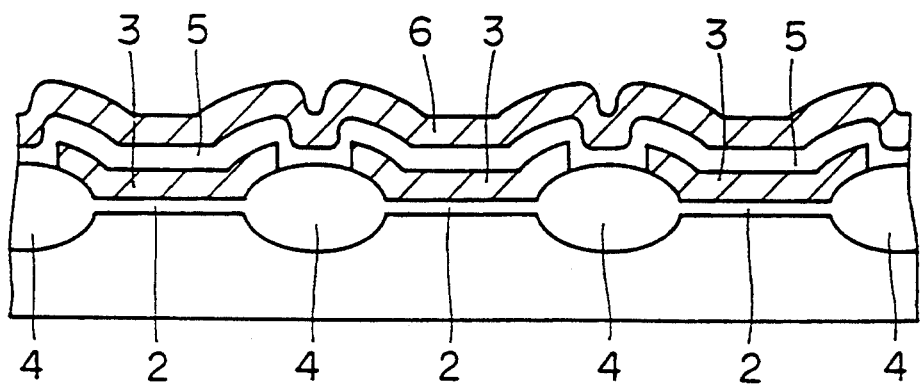
FIG. 4 is a sectional view of the nonvolatile semiconductor memory device of FIG. 1 taken in the direction of the arrow of line W—W.
Figure 5:
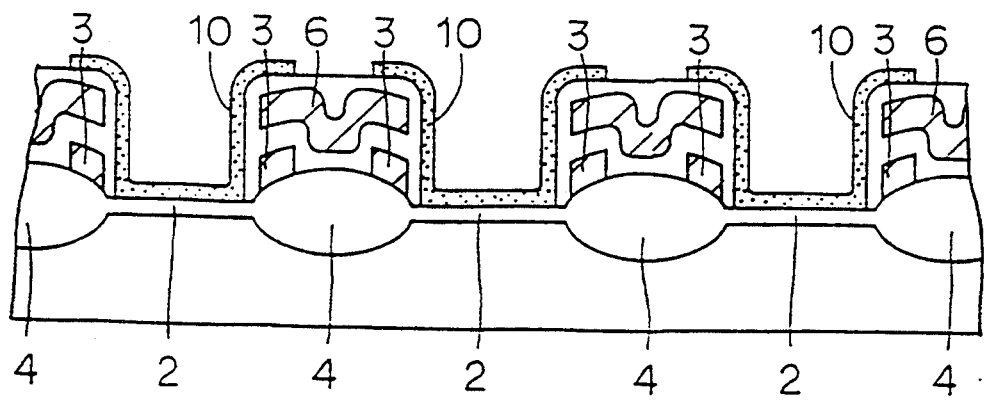
FIG. 5 is sectional view of the nonvolatile semiconductor memory device of FIG. 1 taken in the direction of the arrow of line X—X.

The configuration of control electrode 6 and charge storage electrode 3 will be described with reference to FIGS. 1, 2, 4, and 5. FIG. 4 is a sectional view taken in the direction of the arrow of line W—W of FIG. 1. FIG. 5 is a sectional view taken in the direction of the arrow X—X of FIG. 1.

It can be appreciated from the drawings that charge storage electrode 3 and control electrode 6 have their width in the column direction set wider above element isolation region 4 than above the channel region. Therefore, the opposing area between control electrode 6 and charge storage electrode 3 is increased while the opposing area between charge storage electrode 3 and semiconductor substrate 1 is the same.

Therefore, the capacitance between control electrode 6 and charge storage electrode 3 increases to allow improvement of the coupling ratio. The reason why the opposing area between control electrode 6 and charge storage electrode 3 is not increased above the channel region is due to the fact that this will increase the capacitance between charge storage electrode 3 and semiconductor substrate 1 to prevent improvement of the coupling ratio.

In a region surrounded by element isolation region 4 and charge storage electrode 3, an n type drain region 7 is formed in a predetermined depth from the surface of semiconductor substrate 1, having an impurity concentration of $5 \times 10^{19}$ cm$^{-3}$ and a sheet resistivity of 80 $\Omega/\square$.

In a region outside charge storage electrode 3 sandwiching drain region 7, an n type source region 8 having an impurity concentration of $1 \times 10^{21}$ cm$^{-3}$ and a sheet resistivity of 50 $\Omega/\square$ is formed in a predetermined depth from the surface of semiconductor substrate 1.

A third insulating film 9 is formed covering charge storage electrode 3 and control electrode 6, and partially overlapping a portion of drain region 7 on the main surface of semiconductor substrate 1.

On drain region 7, a first interconnection layer 10 of polysilicon is formed along the sidewall of third interlayer insulating film 9, electrically connected to drain region 7. On first interconnection layer 10, a second interconnection layer 11 of a refractory metal material such as tungsten is provided extending upwards above plane region 7.

Second interconnection layer 11 is connected to respective bit lines 13 formed above interlayer insulating film 12 covering third insulating layer 9 and first interconnection layer 10.

A method of manufacturing a stacked gate type flash memory of the above structure will be described hereinafter with reference to FIGS. 6–23.

On the main surface of a p type semiconductor substrate 1, an element isolation region 4 is formed between each column. A first insulating film 2 of an oxide film is formed to a thickness of approximately 100 Å on an active region enclosed by element isolation region 4. On element isolation 4 and insulating film 2, a first polysilicon layer 3 of a approximately 1000 Å in thickness is deposited using a CVD method.

On polysilicon layer 3, a resist film 70 patterned at a predetermined pitch is formed. Using resist film as a mask, polysilicon layer 3 is etched anisotropically. This results in the planar structure shown in FIG. 6.

Figure 6:
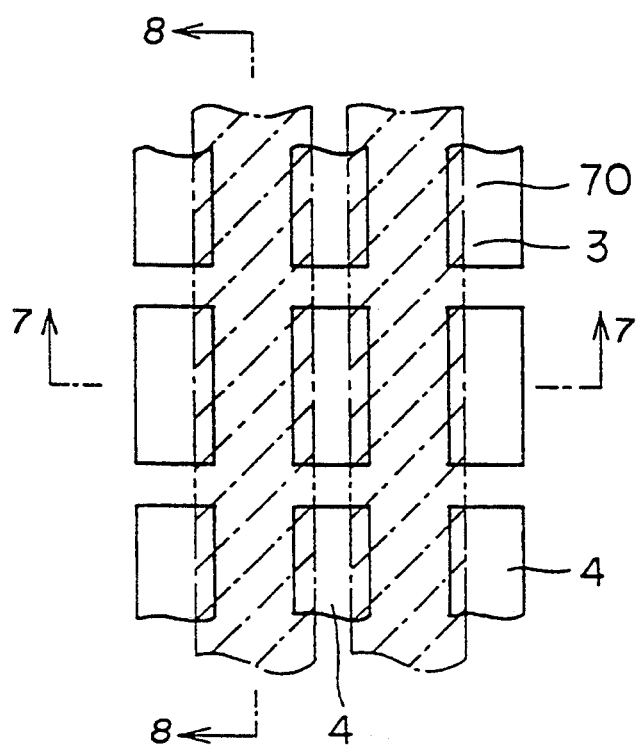
FIG. 6 is a sectional view of a nonvolatile semiconductor memory device according to the present invention showing a manufacturing method thereof of the first step.
Figure 7:
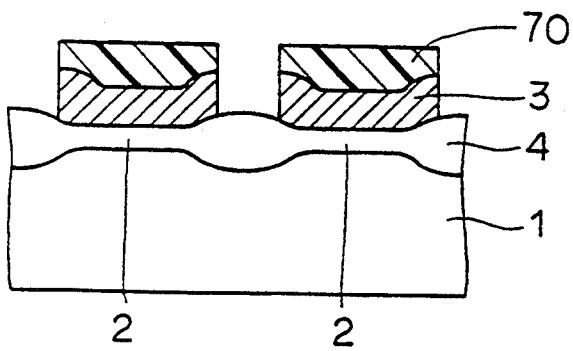
FIG. 7 is a sectional view of the nonvolatile semiconductor memory device of FIG. 6 taken in the direction of the arrow of line Z—Z.
Figure 8:
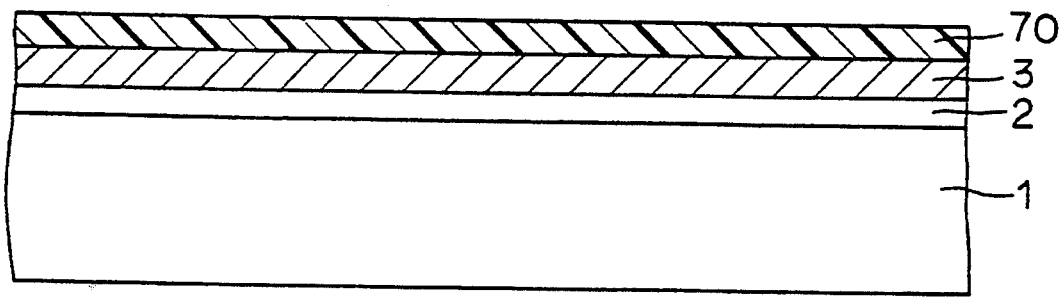
FIG. 8 is a sectional view of the nonvolatile semiconductor memory device of FIG. 6 taken in the direction of the arrow of line V—V.
Figure 9:
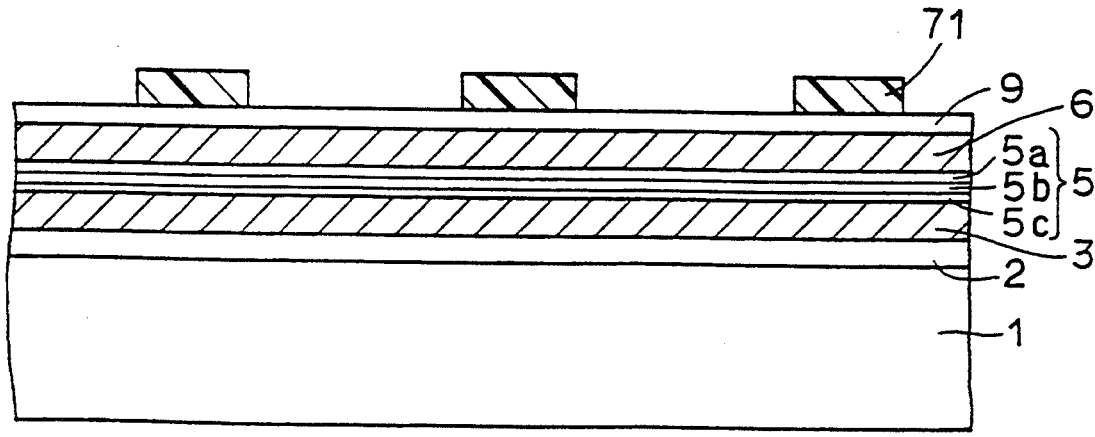
FIG. 9 is a sectional view of a nonvolatile semiconductor memory device according to the present invention showing a second step of the manufacturing method thereof.

FIG. 7 is a sectional view of the stacked gate type flash memory of FIG. 6 taken in the direction of the arrow of line Z—Z. FIG. 8 is a sectional view of the stacked gate type flash memory of FIG. 6 taken in the direction of the arrow of line V—V.

Resist film 70 is removed, and a second insulating film 5 is formed on first polysilicon layer 3 as shown in FIG.

9. Second insulating film 5 is a multilayered film of three layers. First, an oxide film 5a is formed to a thickness of approximately 100 Å. A nitride film 5b is formed to a thickness of approximately 100 Å by a CVD method on oxide film 5a. Then, an oxide film 5c is formed on nitride film 5b to a thickness of approximately 100 Å.

On second insulating film 5, a second polysilicon layer 6 is formed to a thickness of approximately 2500 Å. An oxide film 9 is formed on second polysilicon layer 6. On oxide film 9, a resist film 71 having a predetermined pattern configuration is formed.

Figure 10:
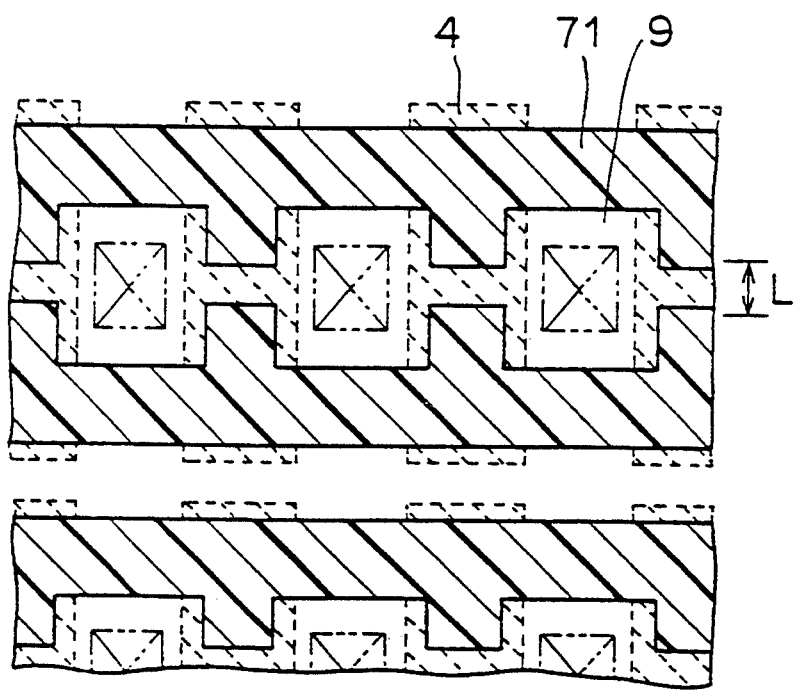
FIG. 10 is a plan view showing the configuration of a resist film in the second step of the manufacturing method of a nonvolatile semiconductor memory device according to the present invention.

Referring to FIG. 10, the planer configuration of resist film 71 shows that its width in the column direction is wider above the element isolation region than above the active region. The row interval pitch (L in the drawing) of resist film 71 is set to the minimum exposure dimension allowed by the current photolithography technique.

Figure 11:
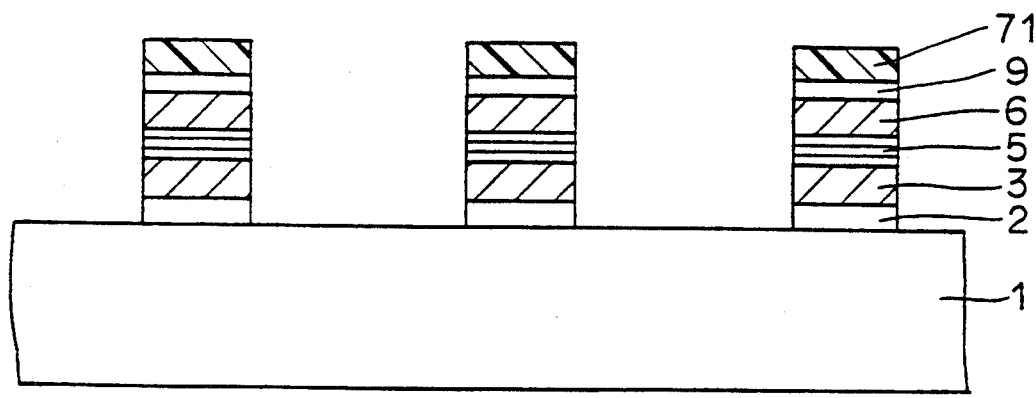
FIGS. 11–23 are sectional views of a nonvolatile semiconductor memory device according to the present invention showing the third-fifteenth steps of the manufacturing method thereof.

Referring to FIG. 11, oxide film 9, second polysilicon layer 6, second insulating film 5, and first polysilicon layer 3 are etched anisotropically using resist film 71 as a mask to form charge storage electrode 3 and control electrode 6.

Figure 12:
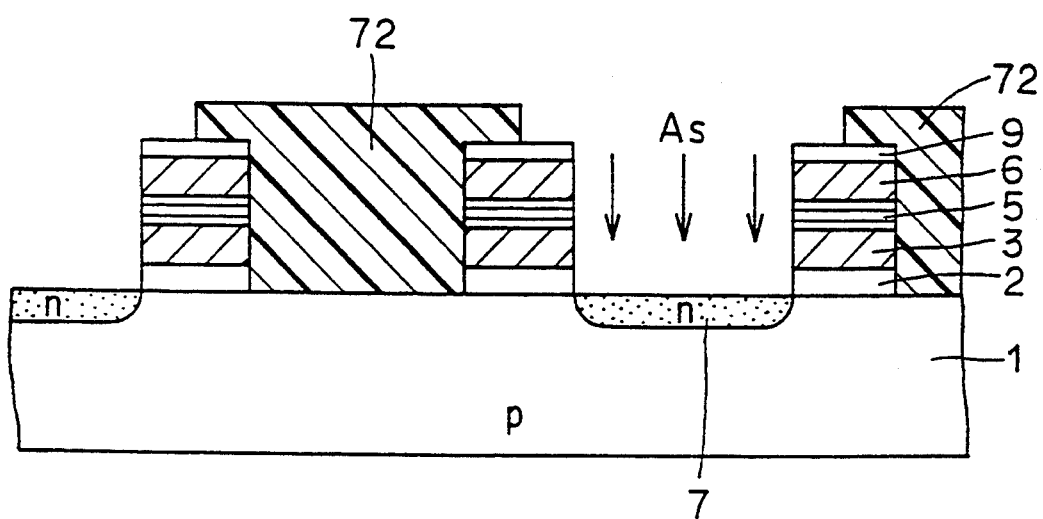

Referring to FIG. 12, resist film 71 is removed. Then, a resist film 72 is formed on the substrate of the area which becomes the source region. Using resist film 72, charge storage electrode 3, and control electrode 6 as a mask, arsenic is introduced into the surface of semiconductor substrate 1 under the conditions of 35 keV and $5.0 \times 10^{14}$ cm$^{-2}$ to form a drain region 7 of a n type impurity region having an impurity concentration of $5 \times 10^{19}$ cm$^{-3}$ and a sheet resistivity of 80 $\Omega/\square$.

Figure 13:
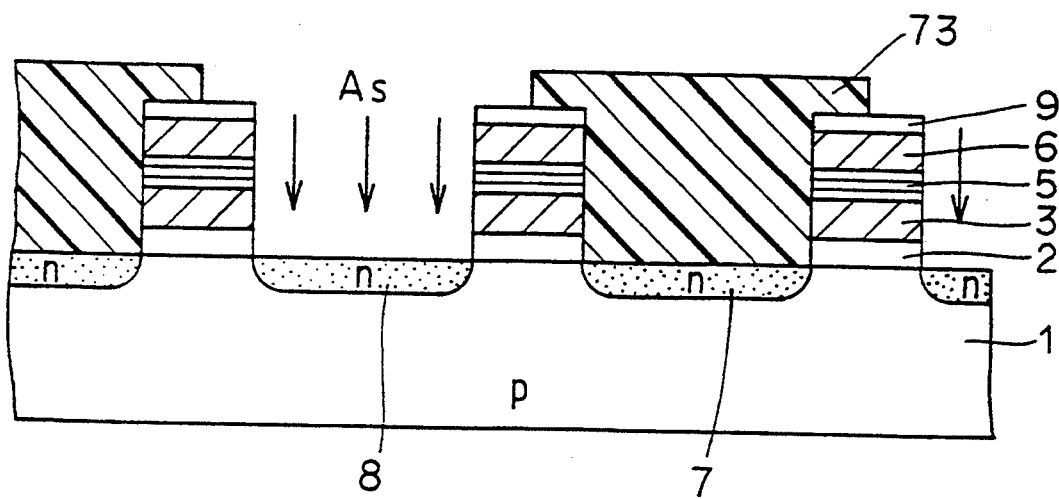

Referring to FIG. 13, resist film 72 is removed. A resist film 73 is formed to cover the surface of drain region 7. Using resist film 73, charge storage electrode 3, and control electrode 6 as a mask, arsenic is introduced into the surface of semiconductor substrate 1 under the conditions of 35 keV and $1 \times 10^{16}$ cm$^{-2}$ to form a source region 8 of an n type impurity region having an impurity concentration of $1 \times 10^{21}$ cm$^{-3}$ and a sheet resistivity of 50 $\Omega/\square$.

Figure 14:
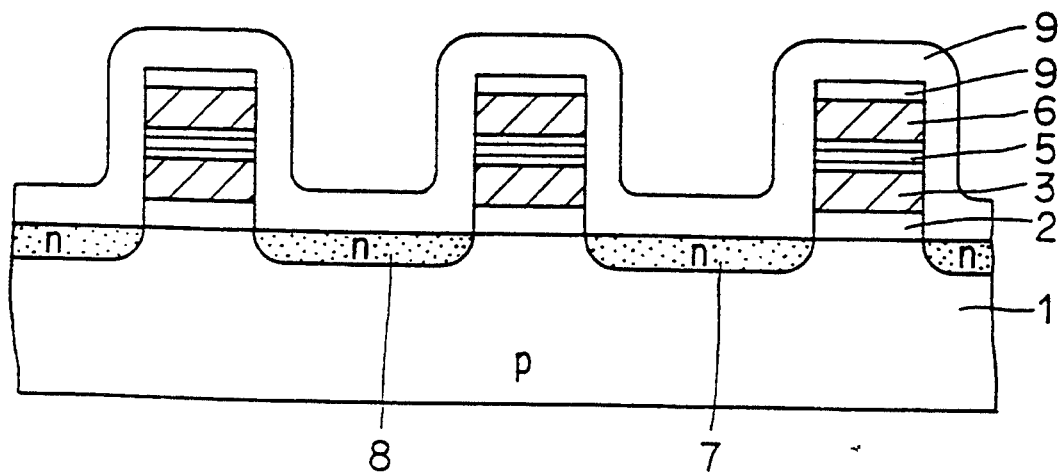
Figure 15:
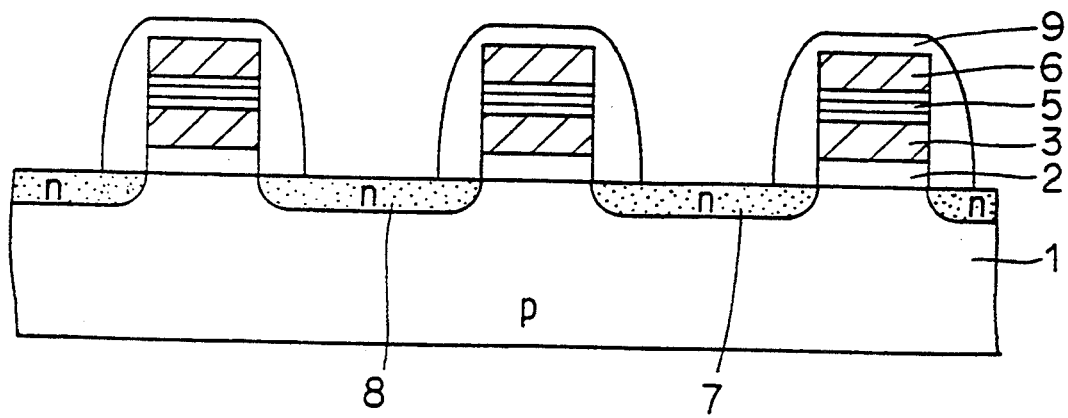

Referring to FIG. 14, resist film 73 is removed. On semiconductor substrate 1, an oxide film 9 is formed. Then, oxide film 9 is etched anisotropically. As a result, a sidewall insulating film 9 of an oxide film is completed as shown in FIG. 15.

Figure 16:
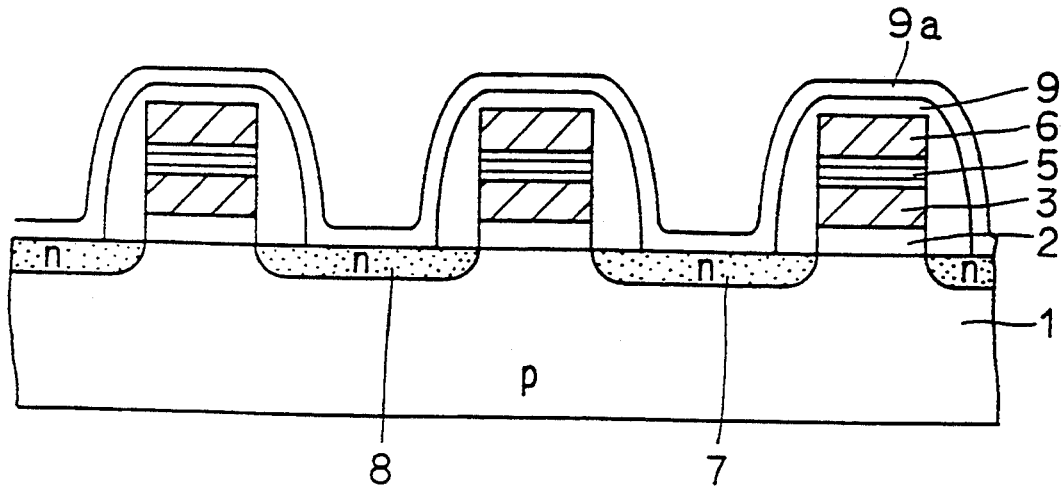

Referring to FIG. 16, an oxide film 9a is formed again on the surface of semiconductor substrate 1.

Figure 17:
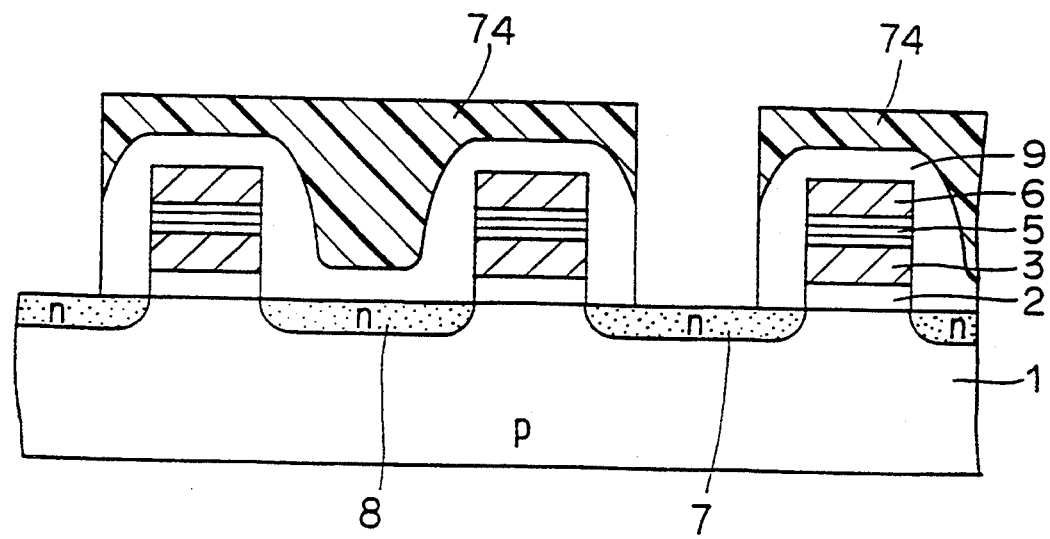

Referring to FIG. 17, a resist film 74 is formed having an opening portion only above drain region 7. Oxide film 9 above drain region 7 is removed by etching.

Figure 18:
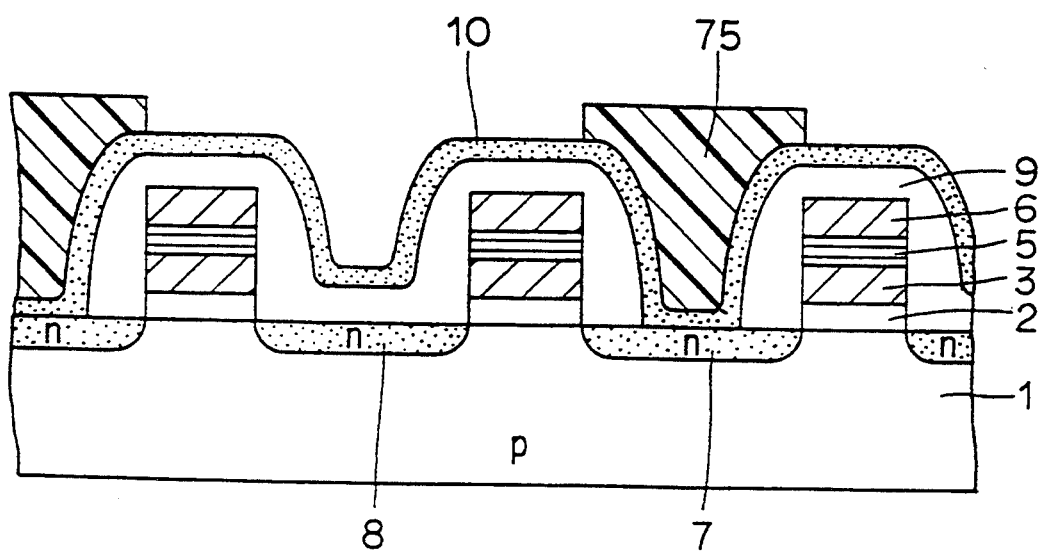

Referring to FIG. 18, a polysilicon 10 is deposited on semiconductor substrate 1. On polysilicon 10, a resist film 75 patterned to a predetermined configuration is formed.

Figure 19:
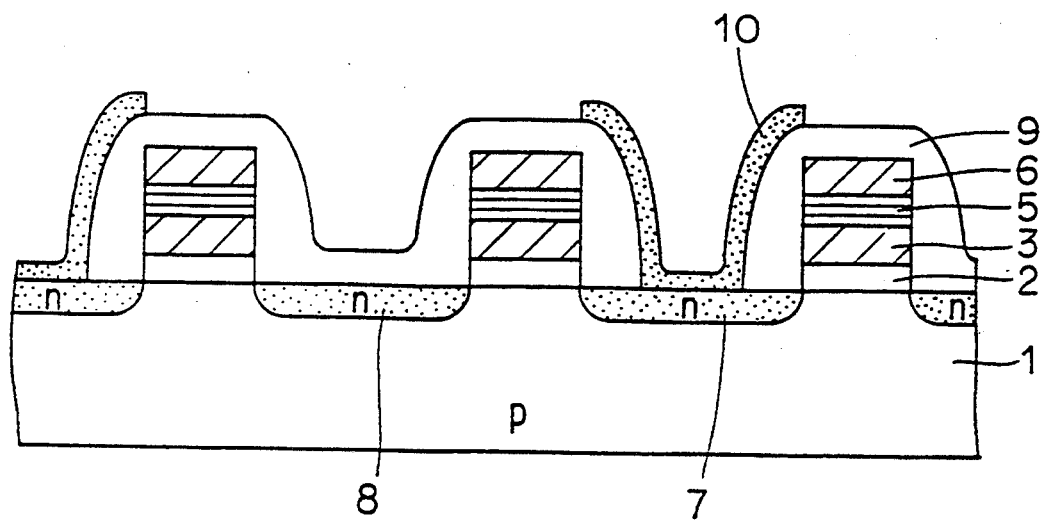

Referring to FIG. 19, polysilicon 10 is etched anisotropically. This results in a first interconnection layer 10 electrically in contact with drain region 7 and formed along the sidewall of sidewall insulating film 9.

Figure 20:
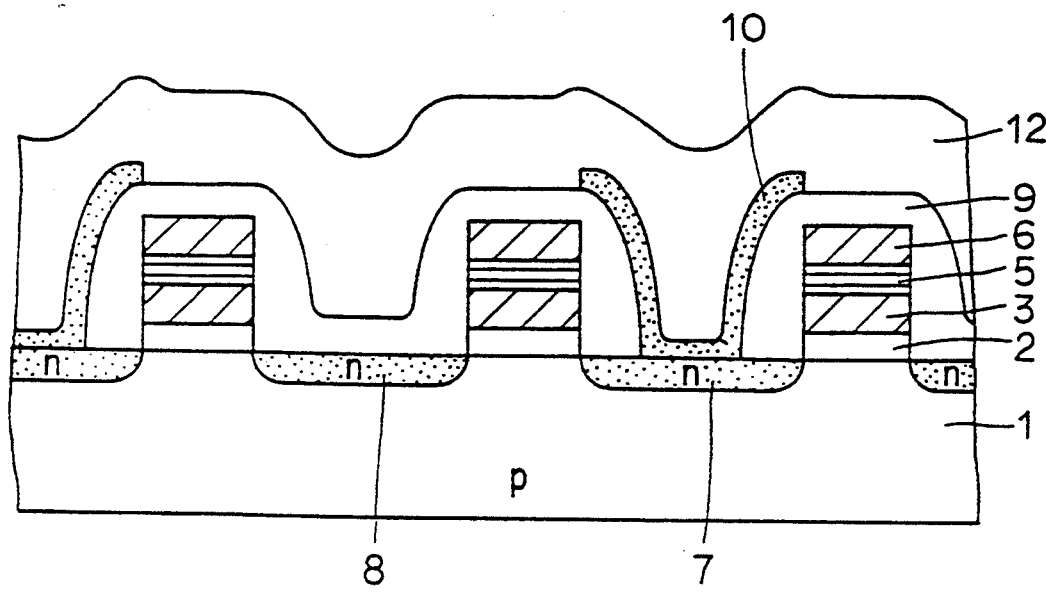
Figure 21:
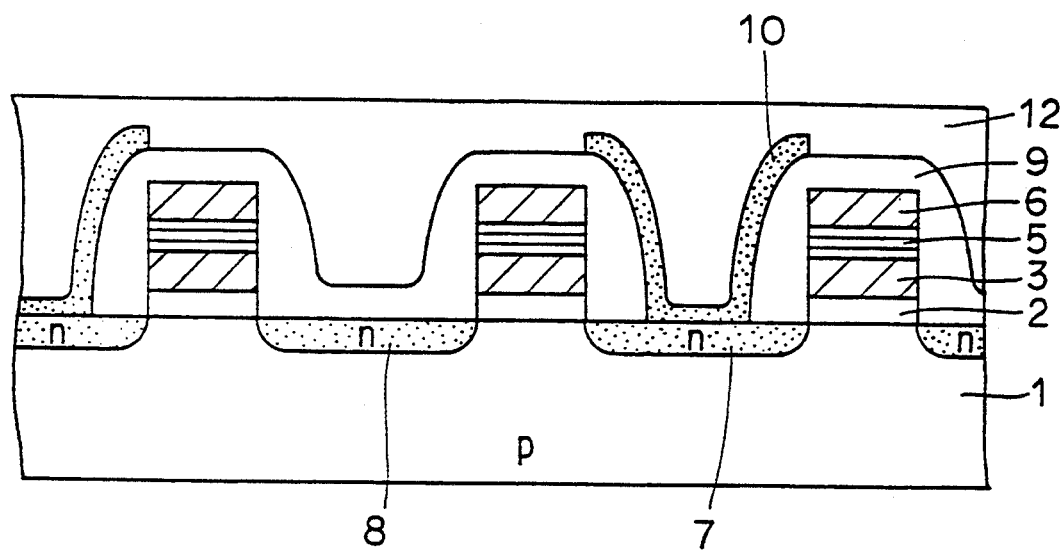

Referring to FIG. 20, an interlayer insulating film 12 is deposited on semiconductor substrate 1 by TEOS. Wet reflow at approximately 900° C. is carried out for 30 minutes to planarize the surface of interlayer insulating film 12. This completes an interlayer insulating film 12 having the surface planarized as shown in FIG. 21.

Figure 22:
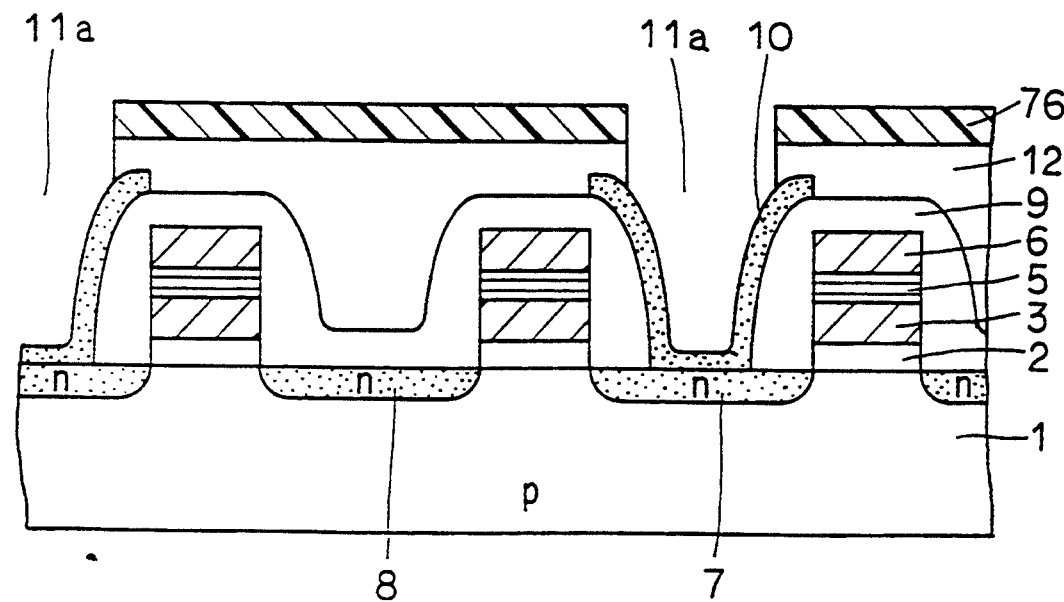

Referring to FIG. 22, a resist film 76 having a pattern of a predetermined hole above drain region 7 is formed on interlayer insulating film 12. Using resist film 76 as a mask, anisotropic etching is applied to form a contact hole 11a in interlayer insulating film 12.

Figure 23:
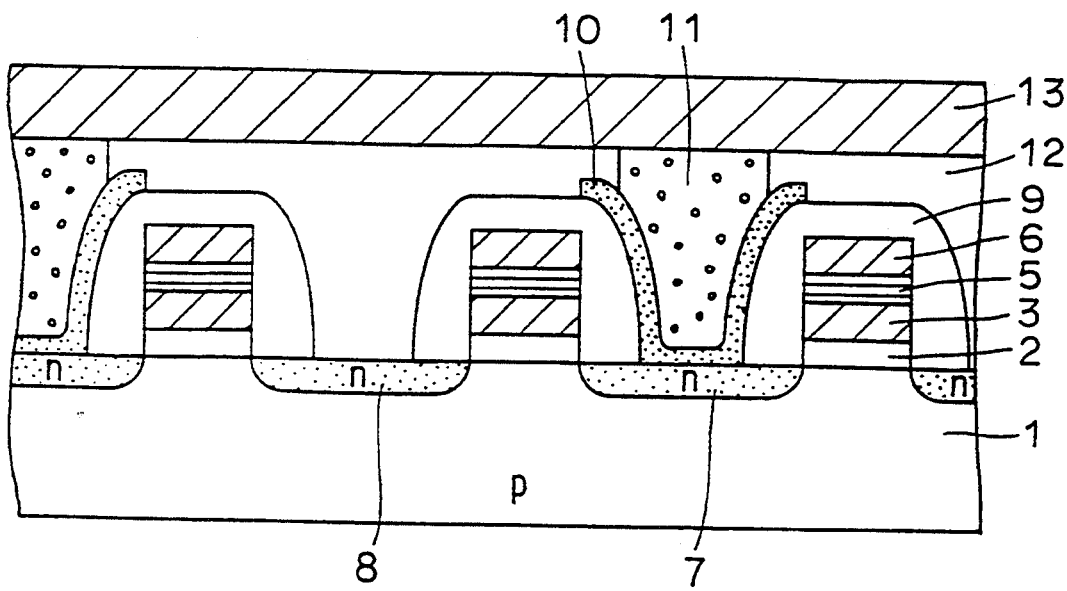
Figure 24:
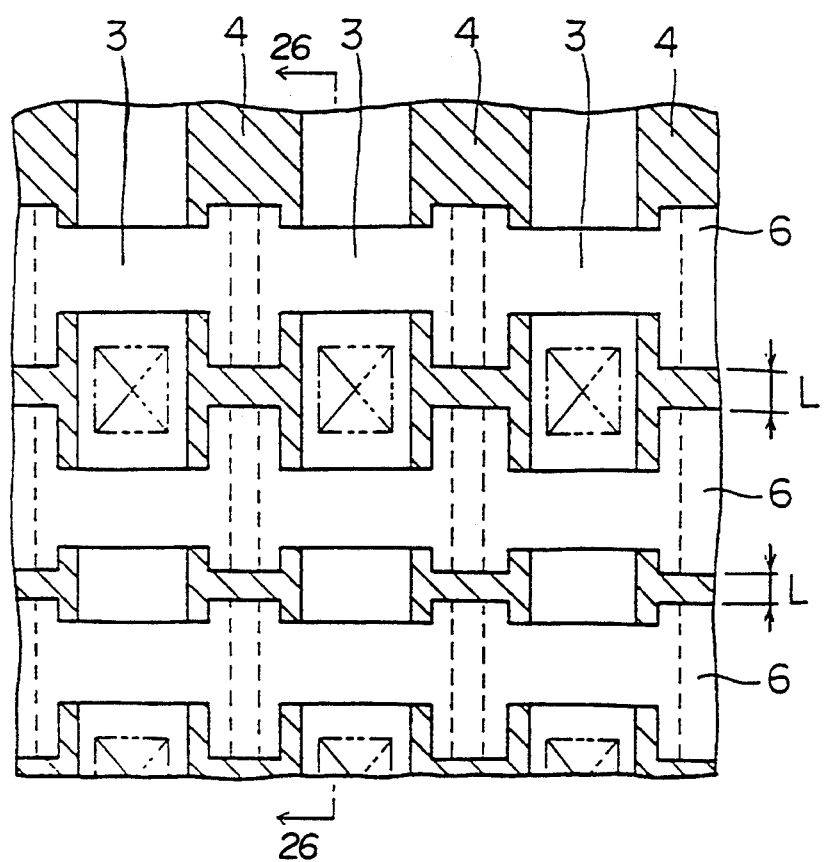
FIG. 24 is a plan view of a nonvolatile semiconductor memory device according to another embodiment of the present invention.
Figure 25:
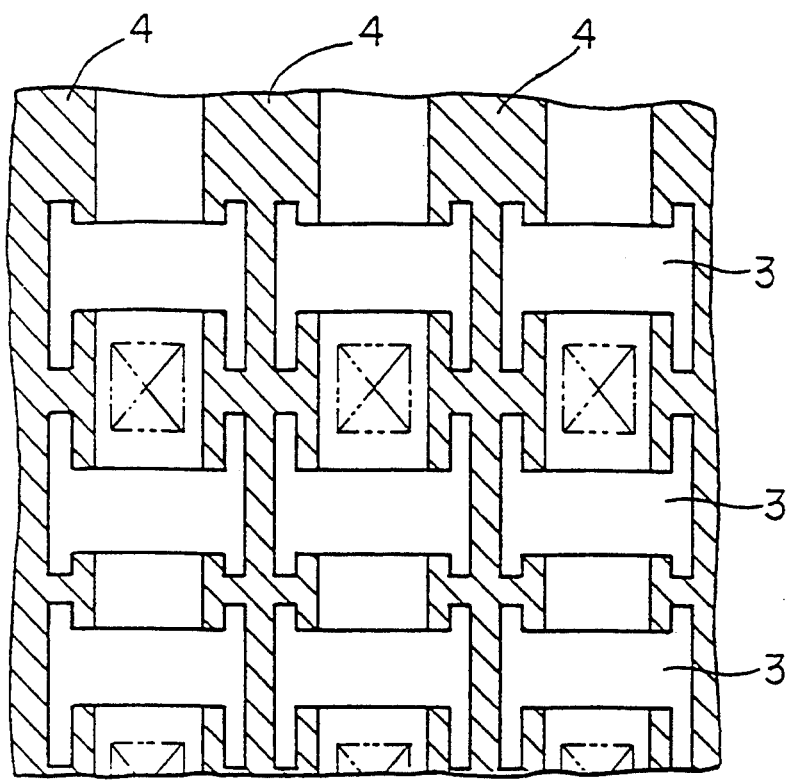
FIG. 25 is a plan view showing the configuration of a control electrode of the nonvolatile semiconductor memory device of FIG. 24.
Figure 26:
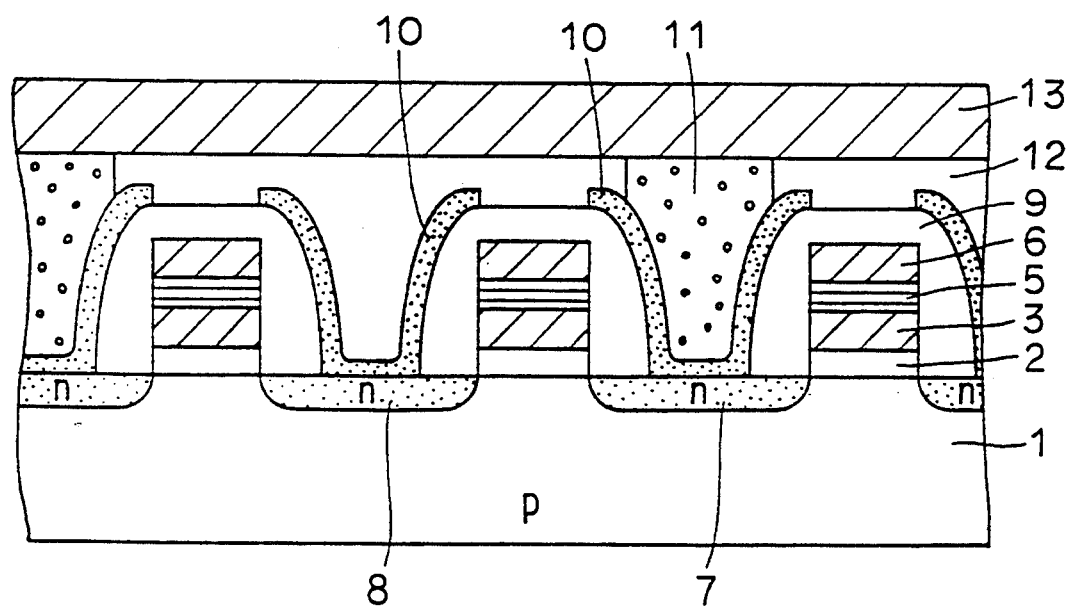
FIG. 26 is a sectional view of the nonvolatile semiconductor memory of FIG. 24 taken in the direction of the arrow of line U—U.
Figure 27:
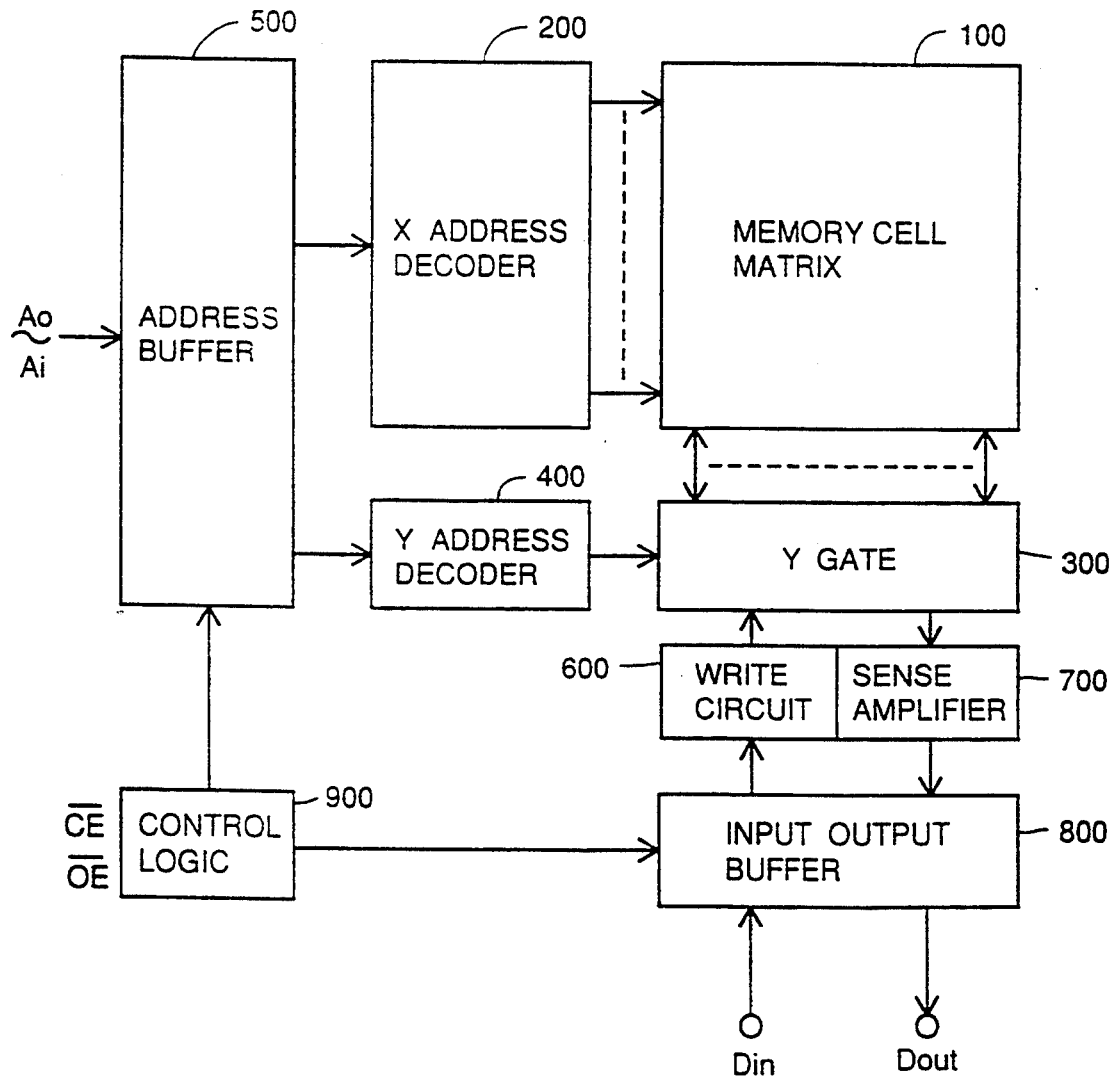
FIG. 27 is a block diagram showing a structure of a conventional flash memory.
Figure 28:
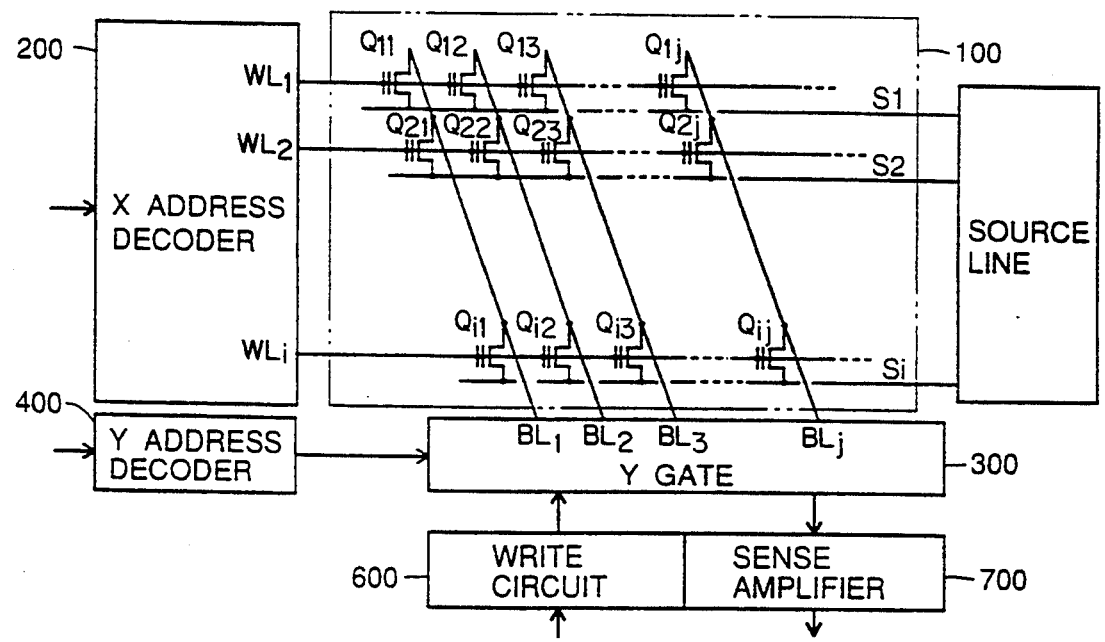
FIG. 28 is an equivalent circuit diagram showing a structure of the memory cell matrix 100 of FIG. 26.
Figure 29:
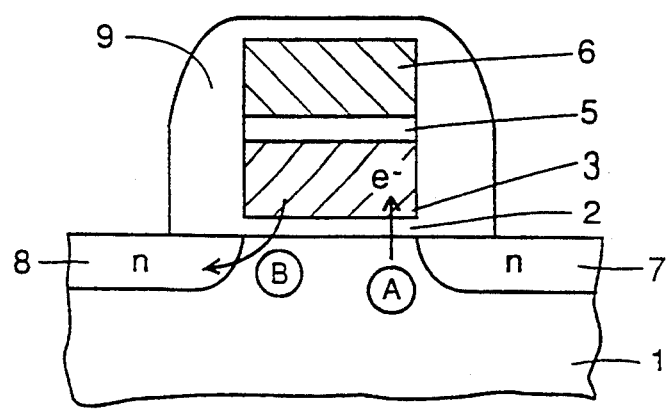
FIG. 29 is a sectional view of a conventional flash memory showing the structure thereof.
Figure 30:
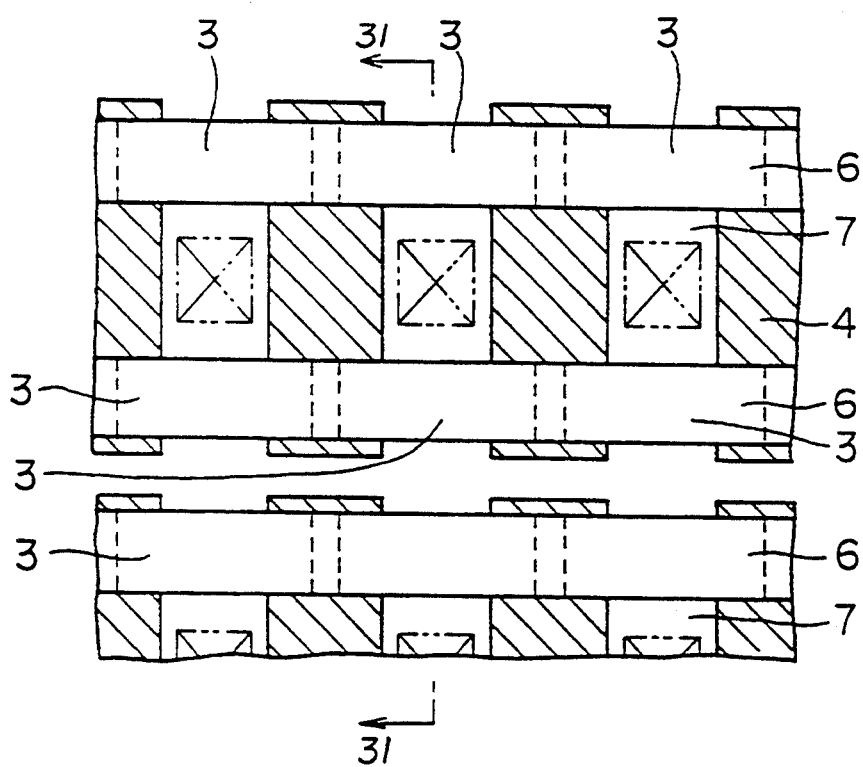
FIG. 30 is a plan view of a conventional flash memory showing the structure thereof.
Figure 31:
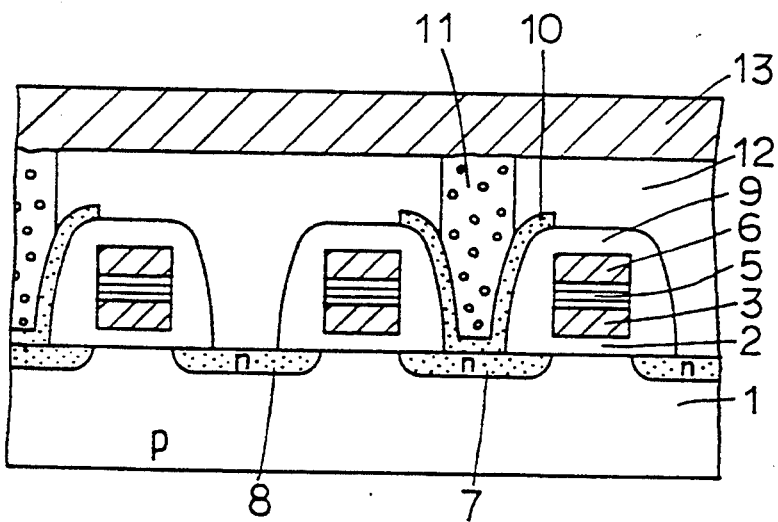
FIG. 31 is a sectional view of the conventional flash memory of FIG. 30 taken in the direction of the arrow of line X—X.
Figure 32:
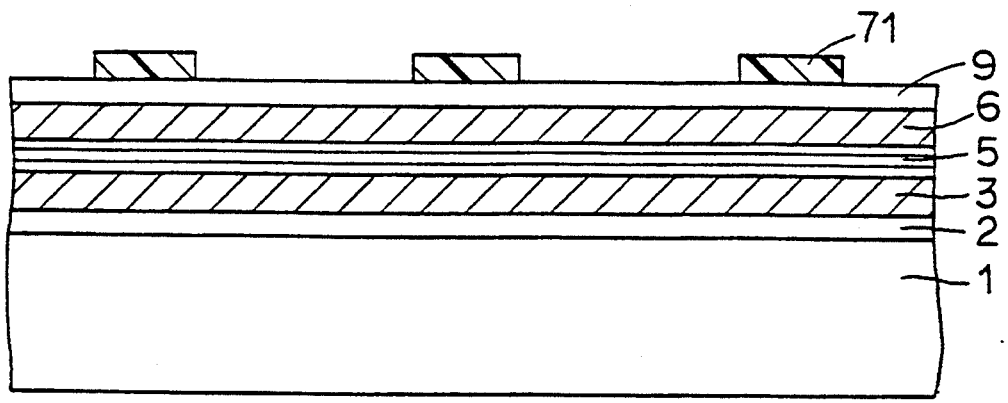
FIG. 32 is a sectional view of a nonvolatile semiconductor memory device according to conventional art showing the first step of a manufacturing method thereof.
Figure 33:
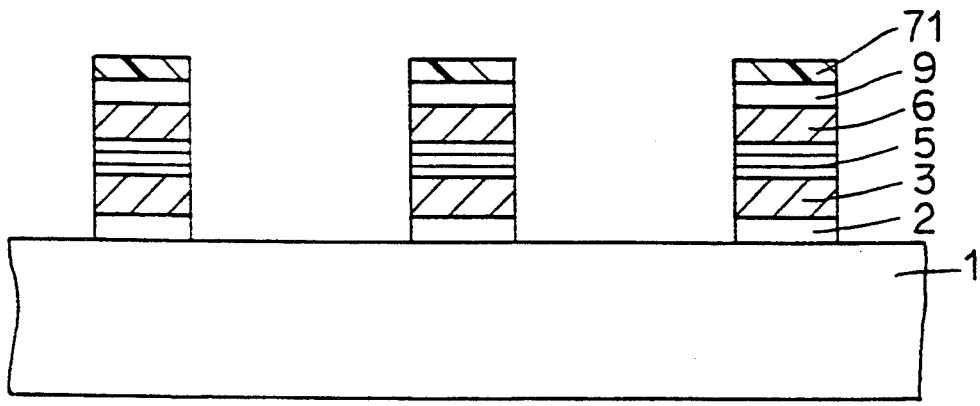
FIG. 33 is a sectional view of the nonvolatile semiconductor memory device according to conventional art showing the second step of the manufacturing method thereof.
Figure 34:
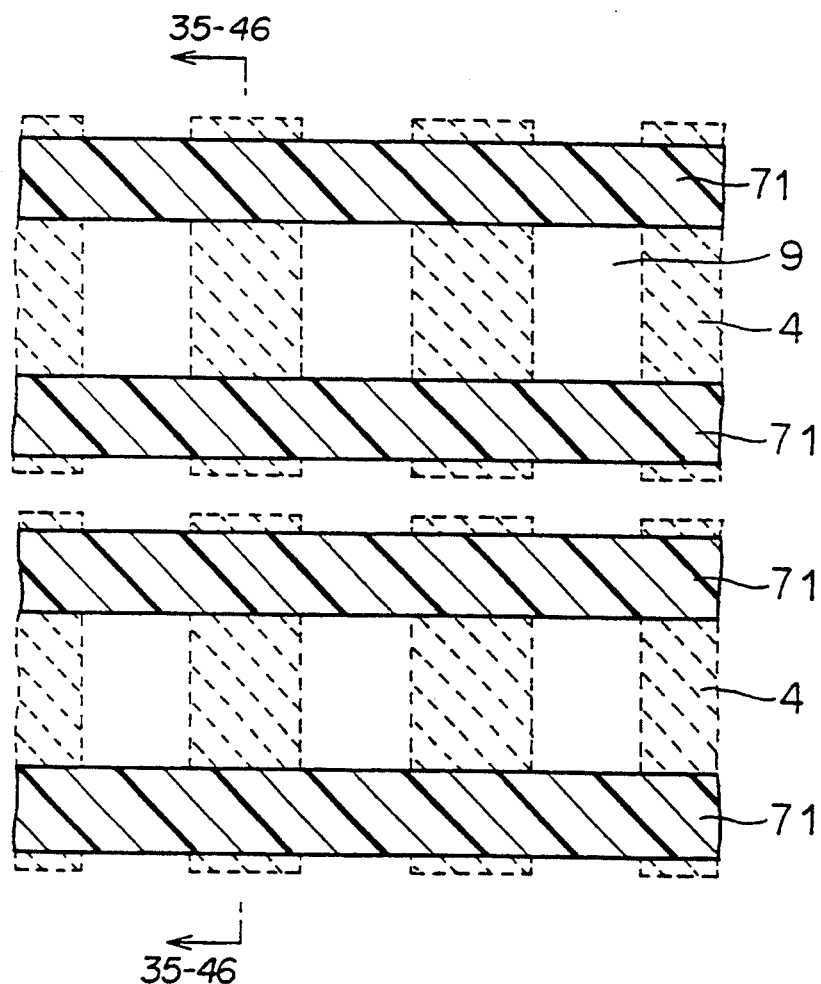
FIG. 34 is a plan showing the configuration of a resist film in the second step of the manufacturing method of the nonvolatile semiconductor memory device of conventional art.
Figure 35:
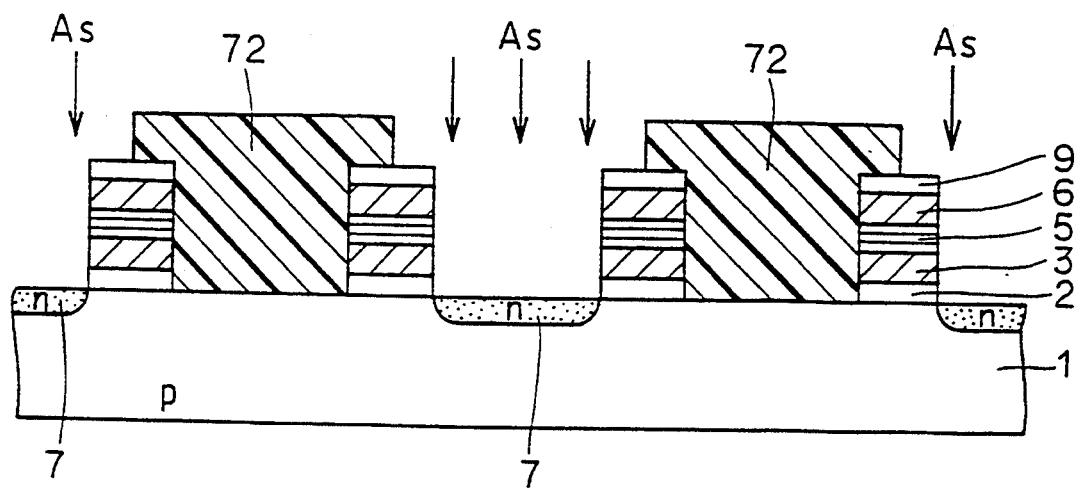
FIGS. 35–46 are sectional views of a nonvolatile semiconductor memory device of conventional art showing the third-fourteenth steps of the manufacturing method thereof.
Figure 36:
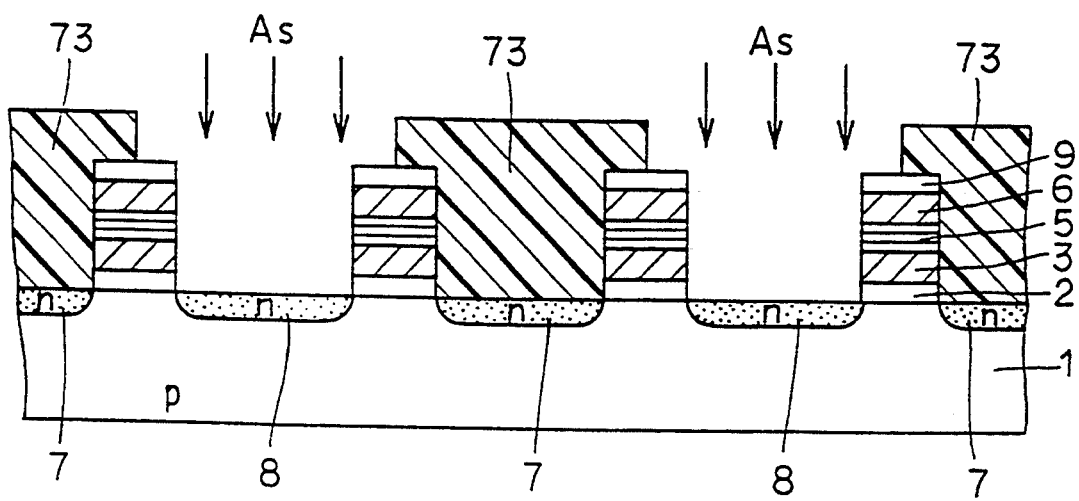
Figure 37:
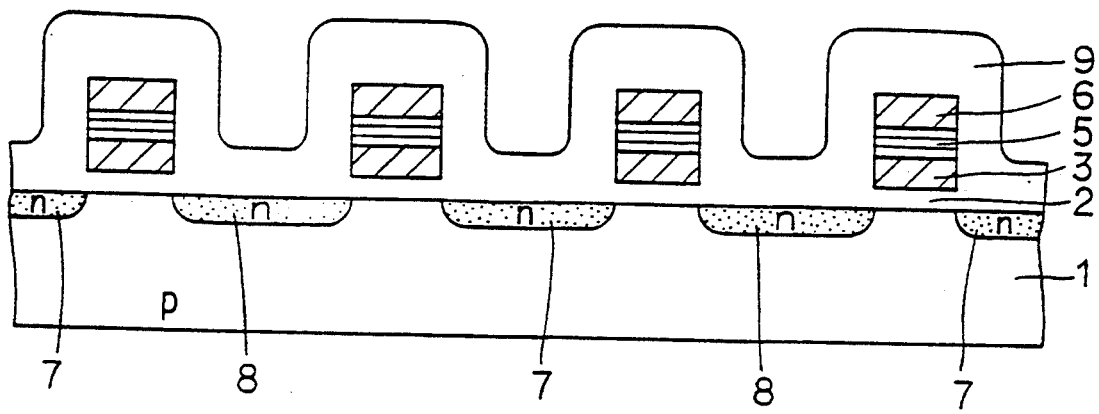
Figure 38:
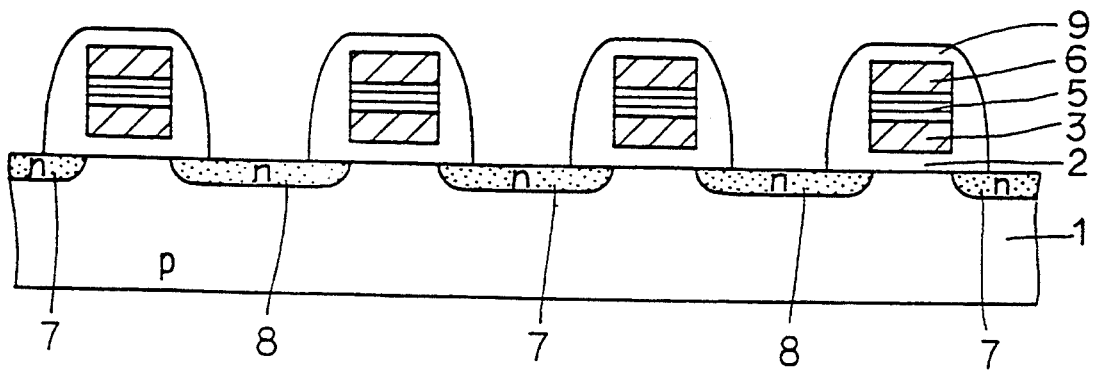
Figure 39:
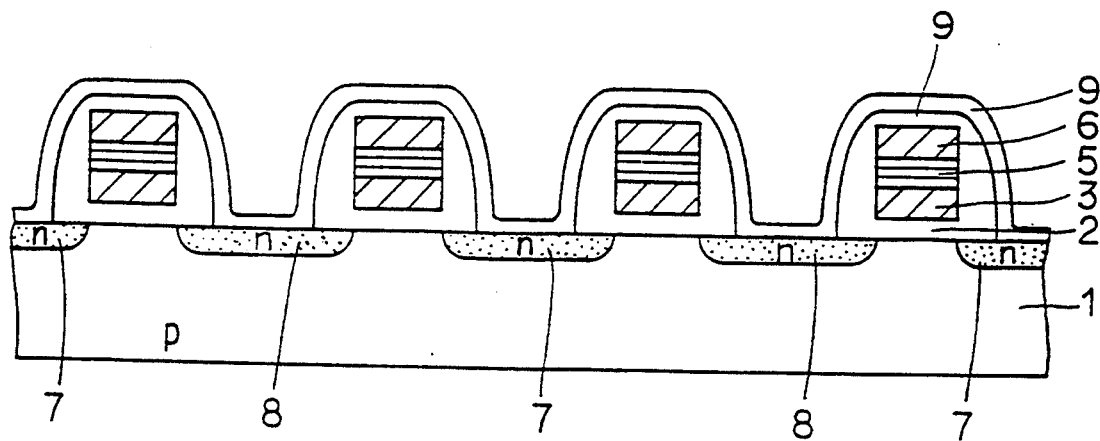
Figure 40:
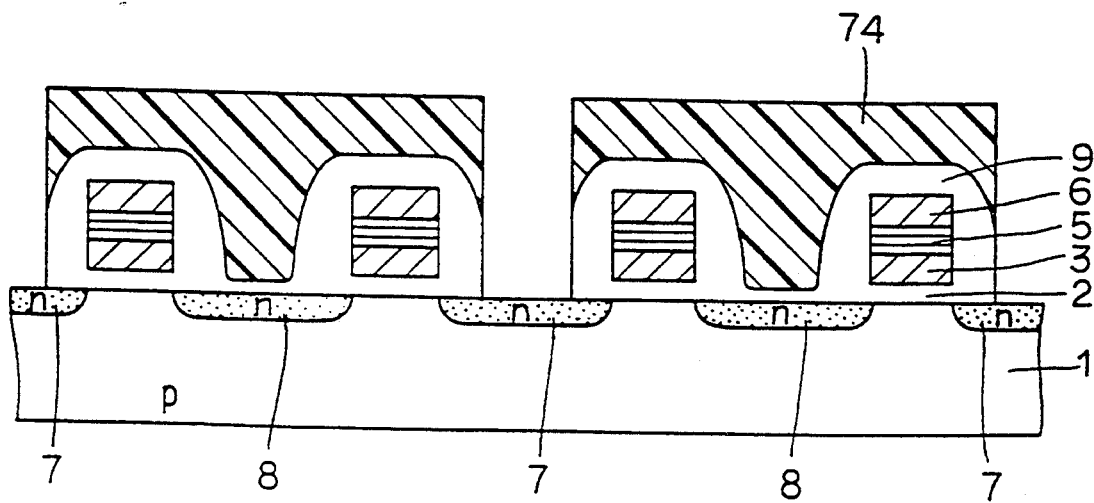
Figure 41:
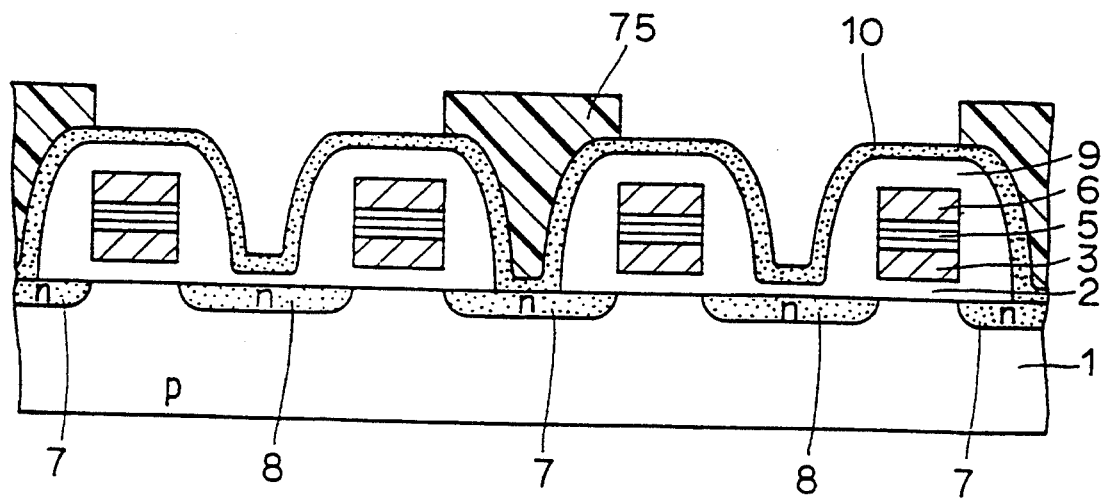
Figure 42:
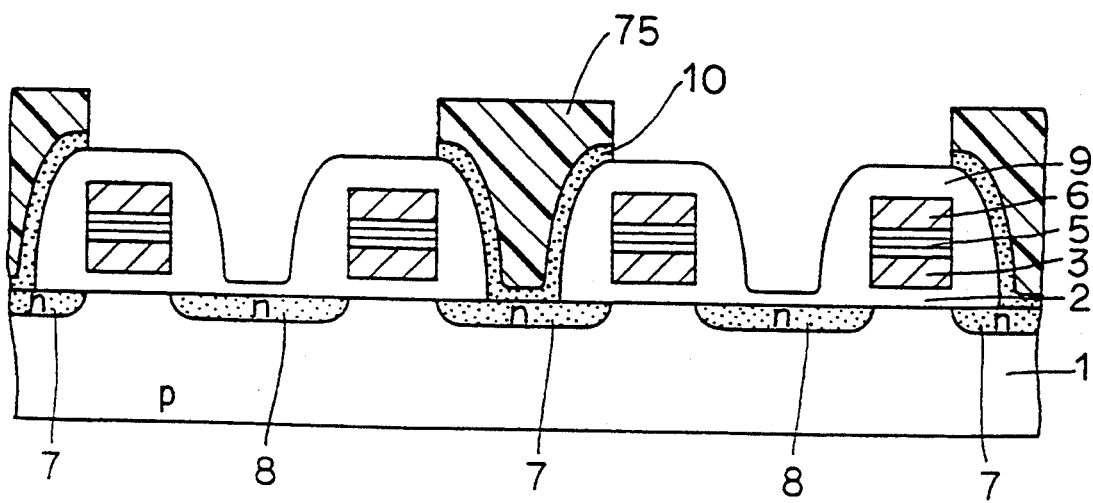
Figure 43:
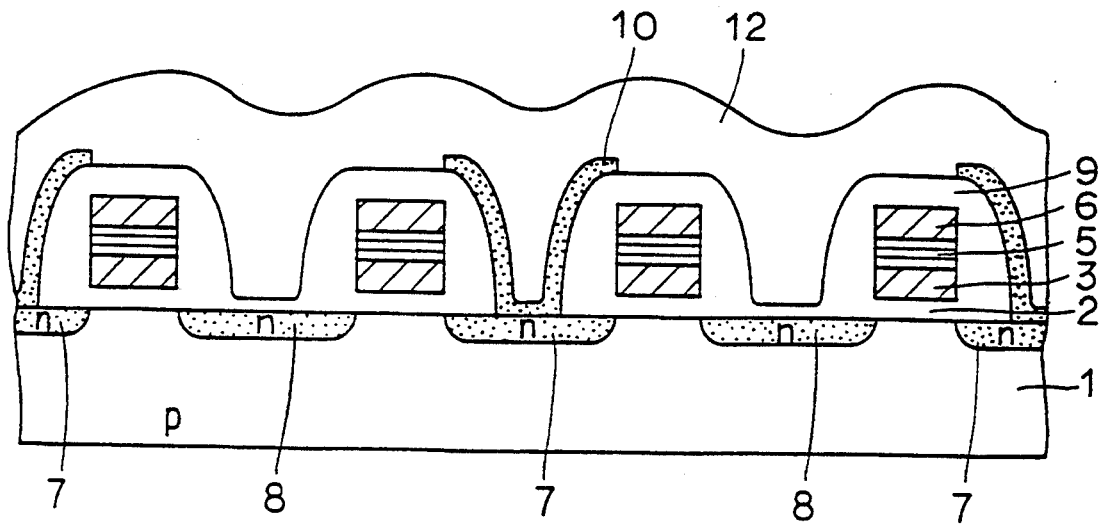
Figure 44:
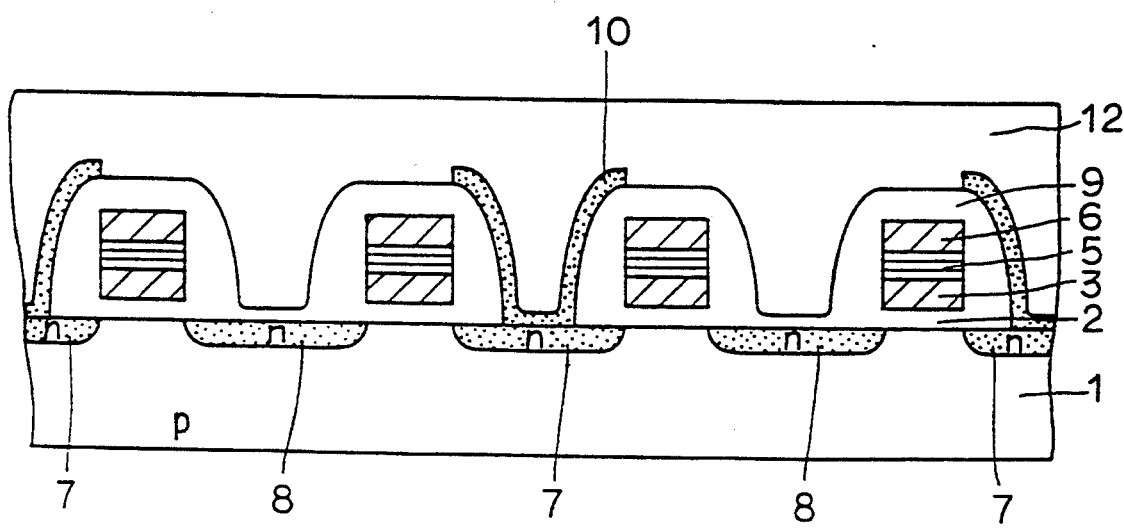
Figure 45:
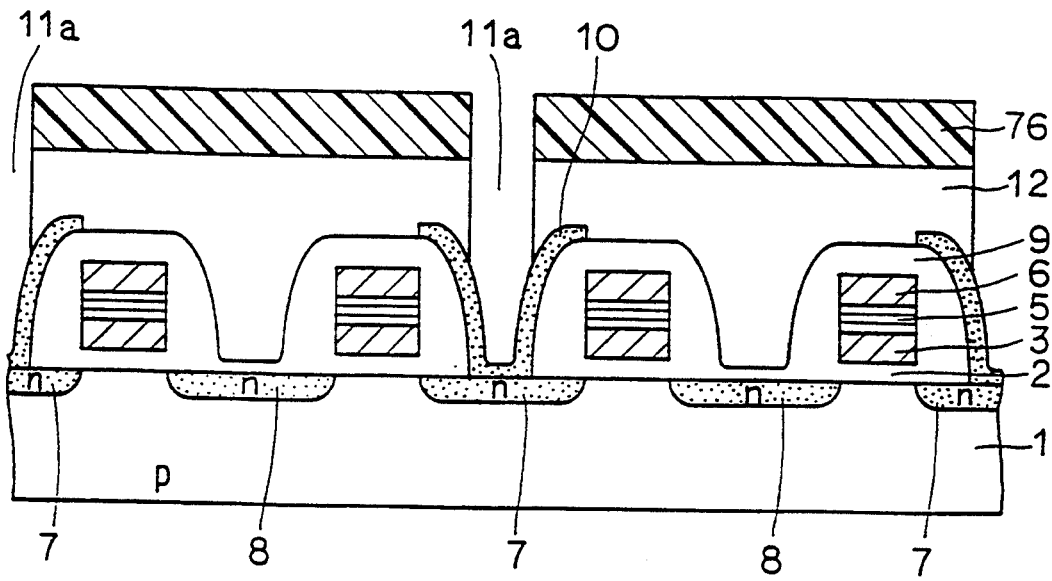
Figure 46:
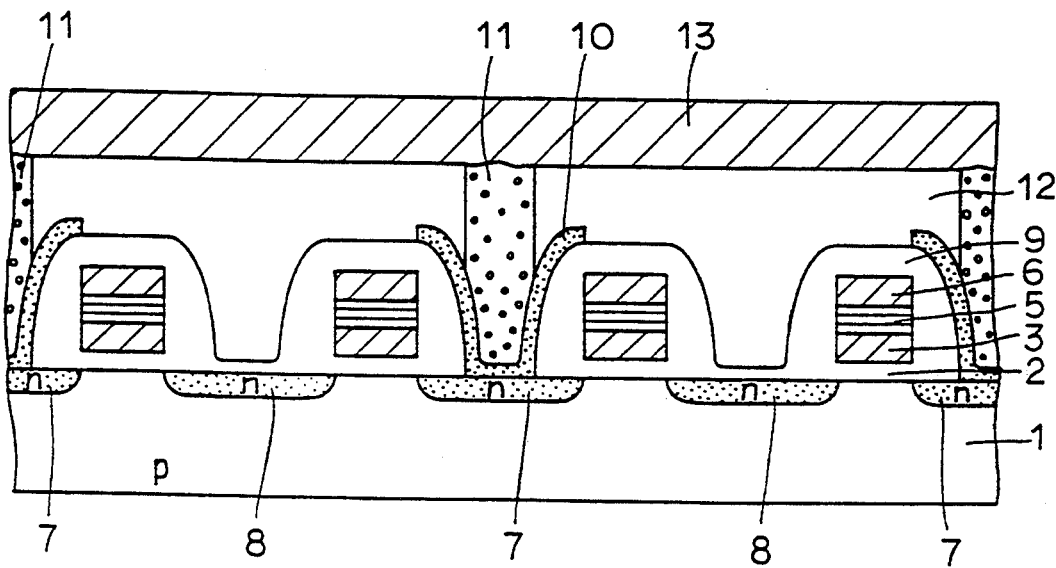
Figure 47:
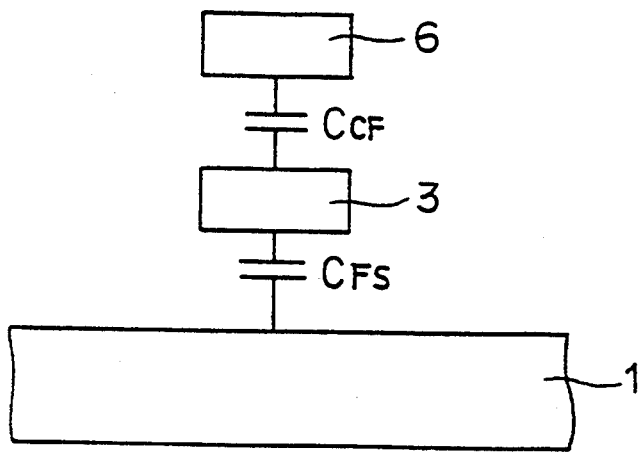
FIG. 47 is a diagram for indicating the capacitance between the control electrode and the charge storage electrode and the capacitance between the charge storage electrode and the semiconductor substrate in a flash memory.
Figure 48:
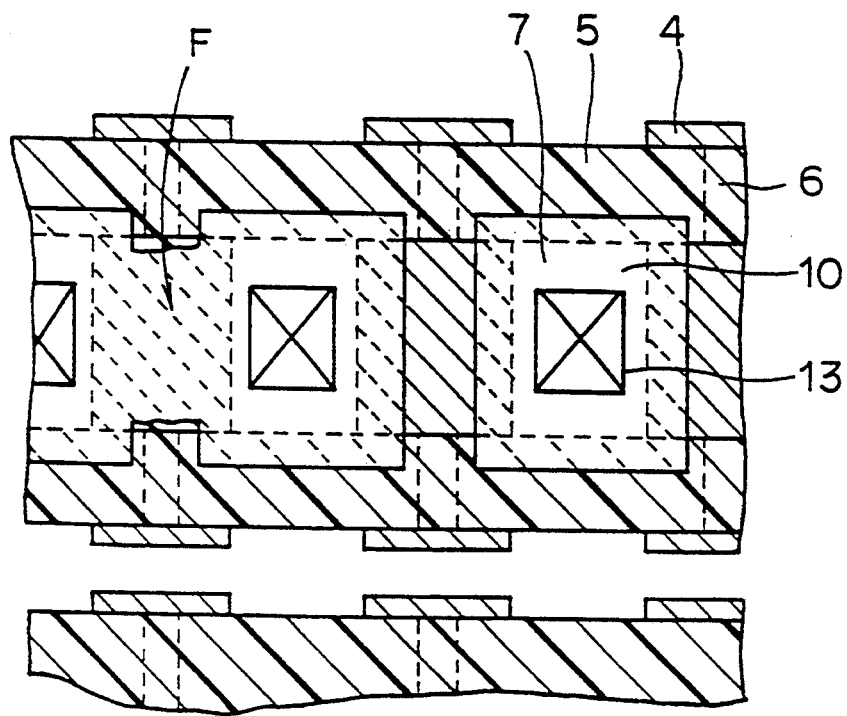
FIG. 48 is a plan view for describing the problems in the patterning process of a first interconnection layer according to conventional art.

Referring to FIG. 23, a second interconnection layer 11 of a refractory metal such as tungsten is formed internal of contact hole 11a. Then, a bit line 13 is formed on interlayer insulating film 12. This completes a stacked gate type flash memory.

According to the above described embodiment of the present invention, the width of the charge storage electrode and the control electrode in the column direction is set to be wider above the element isolation region than above the channel region. The reason why the opposing area between the control electrode and the charge storage electrode is not increased above the channel region is due to the fact that this will also increase the capacitance between the charge storage electrode and the semiconductor substrate to prevent improvement of the coupling ratio.

Thus, the capacitance ($C_{CF}$) between the control electrode and the charge storage electrode becomes greater due to increase in the opposing area of the control electrode and the charge storage electrode. Therefore, the coupling ratio of a nonvolatile semiconductor memory device can be improved. A charge storage electrode requiring a voltage of a certain level can be obtained by applying a voltage lower than in the conventional case to the control electrode to allow low voltage in a nonvolatile semiconductor memory device.

The distance between adjacent charge storage electrodes and control electrodes is reduced above the element isolation region. Therefore, the area between charge storage electrodes and control electrodes are planarized by an oxide film in the formation of a sidewall insulating film. Thus, a first interconnection layer can be patterned easily and precisely.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:
   a semiconductor substrate having a main surface,
   (m×n) charge storage electrodes arranged in a matrix of m rows and n columns on the main surface of said semiconductor substrate with a first insulating film therebetween,
   a pair of impurity regions serving as source/drain regions, formed with a predetermined distance therebetween on the main surface of said semiconductor substrate to sandwich in the column direction a channel region formed right beneath said charge storage electrode,
   an element isolation region formed between each column across two adjacent columns of said charge storage electrode, and
   m control electrodes corresponding to each row and formed on said charge storage electrode with a second insulating film therebetween,
   wherein the width in the column direction of said charge storage electrode and said control electrode above said element isolation region is set to be wider than the width in the column direction of the same above said channel region forming a wider area, so that in said wider area said charge storage electrode and said control electrode above said element isolation region protrude in opposite column directions with respect to the width of said electrodes above said channel region.

2. The nonvolatile semiconductor memory device according to claim 1, wherein the row interval pitch of said charge storage electrode and said control electrode is the minimum practical exposure dimension allowed by photolithography.

3. The nonvolatile semiconductor memory device according to claim 1, wherein said charge storage electrode comprises polysilicon in the thickness of 800–1200 Å.

4. The nonvolatile semiconductor memory device according to claim 1, wherein said control electrode comprises polysilicon in the thickness of approximately 2000–3000 Å.

* * * * *